US009362288B2

(12) United States Patent
Sukekawa

(10) Patent No.: US 9,362,288 B2
(45) Date of Patent: Jun. 7, 2016

(54) SEMICONDUCTOR DEVICE AND MANUFACTURING METHOD THEREOF

(71) Applicant: PS4 LUXCO S.A.R.L., Luxembourg (LU)

(72) Inventor: Mitsunari Sukekawa, Tokyo (JP)

(73) Assignee: PS4 LUXCO S.A.R.L., Luxembourg (LU)

( * ) Notice: Subject to any disclaimer, the term of this patent is extended or adjusted under 35 U.S.C. 154(b) by 0 days.

(21) Appl. No.: 14/427,964

(22) PCT Filed: Sep. 6, 2013

(86) PCT No.: PCT/JP2013/074778
§ 371 (c)(1),
(2) Date: Mar. 12, 2015

(87) PCT Pub. No.: WO2014/042233
PCT Pub. Date: Mar. 20, 2014

(65) Prior Publication Data
US 2015/0214232 A1    Jul. 30, 2015

(30) Foreign Application Priority Data

Sep. 12, 2012  (JP) .................................. 2012-200341

(51) Int. Cl.
*H01L 21/00*   (2006.01)
*H01L 27/00*   (2006.01)
(Continued)

(52) U.S. Cl.
CPC .... *H01L 27/10823* (2013.01); *H01L 21/76897* (2013.01); *H01L 27/10808* (2013.01);
(Continued)

(58) Field of Classification Search
CPC .................. H01L 27/10823; H01L 27/10885; H01L 27/10888; H01L 27/10808; H01L 27/10876; H01L 29/66666; H01L 29/7827; H01L 21/76897; H01L 21/923487; H01L 21/823437; H01L 27/10814; H01L 27/10826; H01L 27/10879; H01L 27/10855; H01L 29/10876

See application file for complete search history.

(56) References Cited

U.S. PATENT DOCUMENTS

| 6,707,092 | B2 * | 3/2004 | Sasaki ........................... 257/301 |
| 2003/0030090 | A1 * | 2/2003 | Sasaki ........................... 257/301 |
| 2009/0026522 | A1 | 1/2009 | Ananthan |

FOREIGN PATENT DOCUMENTS

| JP | 2011254062 | 12/2011 |
| JP | 2012074684 | 4/2012 |

OTHER PUBLICATIONS

Application No. PCT/JP2013/074778, International Search Report, Oct. 15, 2013.

*Primary Examiner* — Nikolay Yushin
(74) *Attorney, Agent, or Firm* — Kunzler Law Group, PC

(57) ABSTRACT

One semiconductor device includes an active region extending in a first direction, and first, second, and third semiconductor pillars which are provided upright relative to a main surface of the active region and disposed side by side in succession in the first direction; and between the first semiconductor pillar and the second semiconductor pillar, a first gate insulating film in contact with a side surface of the first semiconductor pillar, a first gate electrode in contact with the first gate insulating film, a second gate insulating film in contact with a side surface of the second semiconductor pillar, a second gate electrode in contact with the second gate insulating film, and a first embedded insulating film located between the first and second gate electrodes; and between the second and third semiconductor pillars, a second embedded insulating film in contact with the side surfaces of the second and third semiconductor pillars.

17 Claims, 24 Drawing Sheets

(51) Int. Cl.
*H01L 29/00* (2006.01)
*H01L 27/108* (2006.01)
*H01L 21/768* (2006.01)
*H01L 29/66* (2006.01)
*H01L 29/78* (2006.01)

(52) U.S. Cl.
CPC .... *H01L27/10814* (2013.01); *H01L 27/10826* (2013.01); *H01L 27/10855* (2013.01); *H01L 27/10876* (2013.01); *H01L 27/10879* (2013.01); *H01L 27/10885* (2013.01); *H01L 27/10888* (2013.01); *H01L 29/66666* (2013.01); *H01L 29/7827* (2013.01)

SEMICONDUCTOR DEVICE AND MANUFACTURING METHOD THEREOF

TECHNICAL FIELD

The present invention relates to a semiconductor device and a method for manufacturing the same.

BACKGROUND

Over recent years, as the miniaturization of semiconductor devices has progressed, the planar region occupied by semiconductor elements has become smaller, and regions in which transistors are formed (active regions) have become smaller. In a planar transistor, as the size of the active region decreases, the channel length or the channel width decreases, giving rise to problems such as a short channel effect.

Accordingly, patent literature articles 1 and 2 (Japanese Patent Kokai 2008-311641 and Japanese Patent Kokai 2009-10366) propose semiconductor devices in which, instead of a planar transistor, a vertical transistor in which the channel length and the channel width can be maintained even in a miniaturized region is provided.

In a vertical transistor, unlike in a planar transistor, a semiconductor pillar is formed in a vertical direction on the main surface of a semiconductor substrate, and when the transistor is on, a channel is formed in the semiconductor pillar in a direction perpendicular to said main surface. Therefore vertical transistors can be applied more effectively than planar transistors in semiconductor memory elements, typified by miniaturized DRAMs.

As an application example of a semiconductor device provided with such a vertical transistor, patent literature article 3 (Japanese Patent Kokai 2012-74684) discloses a vertical transistor in which trenches 8a are formed from a plurality of semiconductor pillars 1ba and the main surface of a semiconductor substrate 1, and gate electrodes 8 (word lines W) are provided on the side surfaces of the semiconductor pillars 1ba forming the inside surfaces of the trenches 8a (FIG. 1B). Thus, by providing two gate electrodes 8 in one trench 8a, a semiconductor device supporting miniaturization can be achieved.

PATENT LITERATURE

Patent literature article 1: Japanese Patent Kokai 2008-311641

Patent literature article 2: Japanese Patent Kokai 2009-10366

Patent literature article 3: Japanese Patent Kokai 2012-74684 (FIG. 1B)

SUMMARY OF THE INVENTION

However, with the semiconductor device in patent literature article 3 there is a limit to the number of semiconductor pillars that can be arranged per unit of surface area as seen in plan view. This device can therefore not adequately support miniaturization.

Means of Overcoming the Problems

One mode of embodiment relates to a semiconductor device comprising:
an active region extending in a first direction;
a first semiconductor pillar, a second semiconductor pillar and a third semiconductor pillar which are provided upright relative to a main surface of the active region and which are disposed side by side in succession in the first direction;
between the first semiconductor pillar and the second semiconductor pillar, a first gate insulating film which is in contact with a side surface of the first semiconductor pillar;
a first gate electrode which is in contact with the first gate insulating film;
between the first semiconductor pillar and the second semiconductor pillar, a second gate insulating film which is in contact with a side surface of the second semiconductor pillar;
a second gate electrode which is in contact with the second gate insulating film;
a first embedded insulating film located between the first gate electrode and the second gate electrode; and
between the second semiconductor pillar and the third semiconductor pillar, a second embedded insulating film which is in contact with the side surfaces of the second semiconductor pillar and the third semiconductor pillar.

Another mode of embodiment relates to a semiconductor device comprising:
a semiconductor pillar provided in such a way that it is upright relative to a main surface of a semiconductor substrate;
a first impurity-diffused region provided in an upper portion of the semiconductor pillar;
a second impurity-diffused region provided in the semiconductor substrate located directly below the semiconductor pillar; and
a gate insulating film and a gate electrode provided successively on one side surface of the semiconductor pillar.

Another mode of embodiment relates to a method of manufacturing a semiconductor device, comprising:
a process of forming an active region extending in a first direction;
a process of forming a first semiconductor pillar, a second semiconductor pillar and a third semiconductor pillar which are provided upright relative to a main surface of the active region and which are disposed side by side in succession in the first direction;
a process of forming, between the first semiconductor pillar and the second semiconductor pillar, a first gate insulating film which is in contact with a side surface of the first semiconductor pillar, and a second gate insulating film which is in contact with a side surface of the second semiconductor pillar;
a process of forming a first gate electrode which is in contact with the first gate insulating film, and a second gate electrode which is in contact with the second gate insulating film;
a process of forming a second embedded insulating film which is between the second semiconductor pillar and the third semiconductor pillar and which is in contact with the side surfaces of the second semiconductor pillar and the third semiconductor pillar; and
a process of forming a first embedded insulating film between the first gate electrode and the second gate electrode, after the first and second gate insulating films and the first and second gate electrodes have been formed.

Advantages of the Invention

The present invention makes it possible to provide a semiconductor device which supports miniaturization.

MODES OF EMBODYING THE INVENTION

A semiconductor device and a method of manufacturing the same, being modes of embodying the present invention, will now be described with reference to the drawings. Identical reference codes are assigned to identical members, and explanations thereof are omitted or simplified. Further, reference codes are omitted as appropriate for identical members. It should be noted that the drawings used in the following description are schematic, and the ratios between length, width and thickness, for example, are not necessarily the same as would actually be the case. In the following modes of embodiment, conditions such as materials and dimensions that are shown specifically are merely shown by way of example.

(Semiconductor Device)

Figure 1:
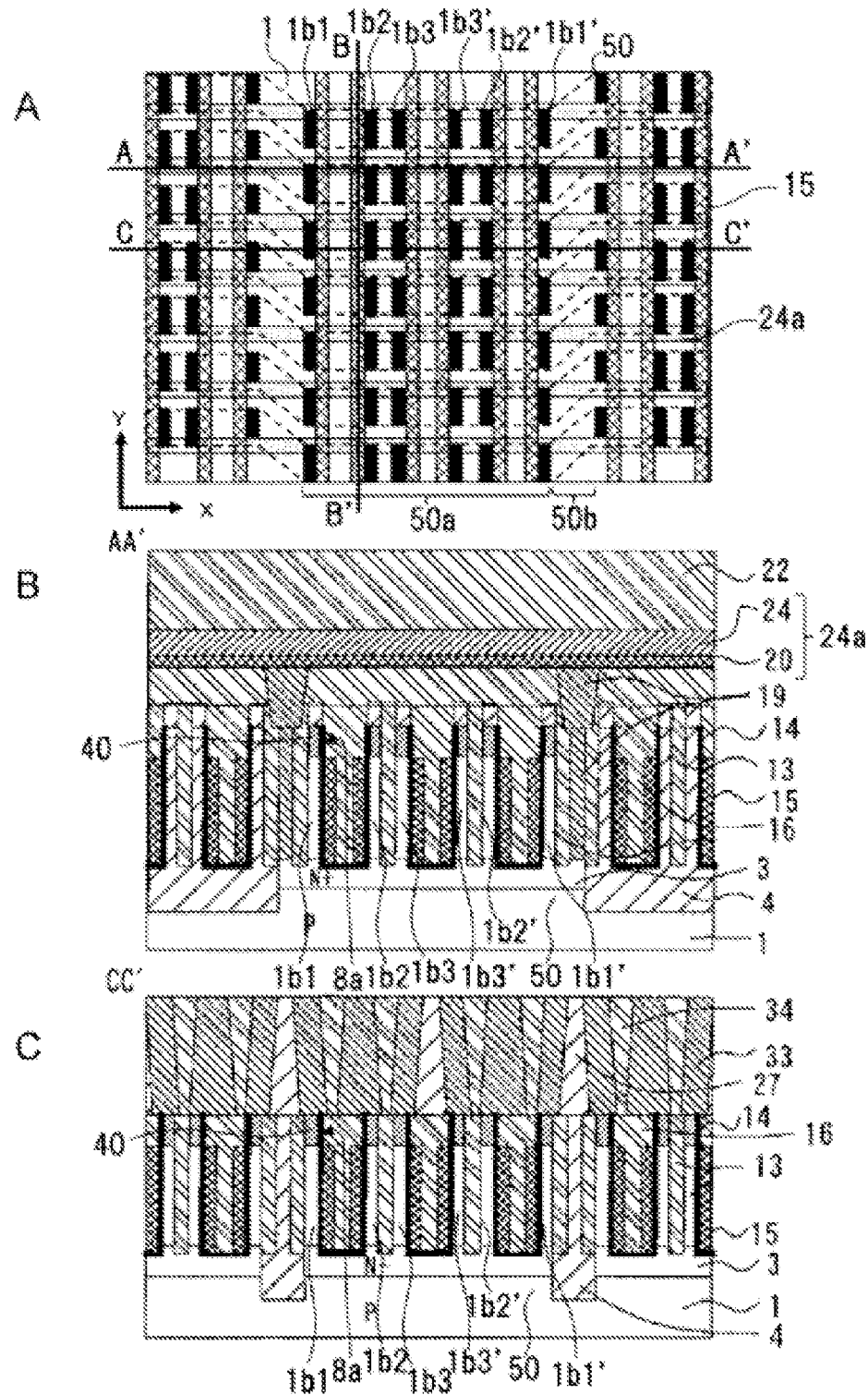
FIG. 1 is a plan view illustrating one example of a semiconductor device according to the present invention.
Figure 2:
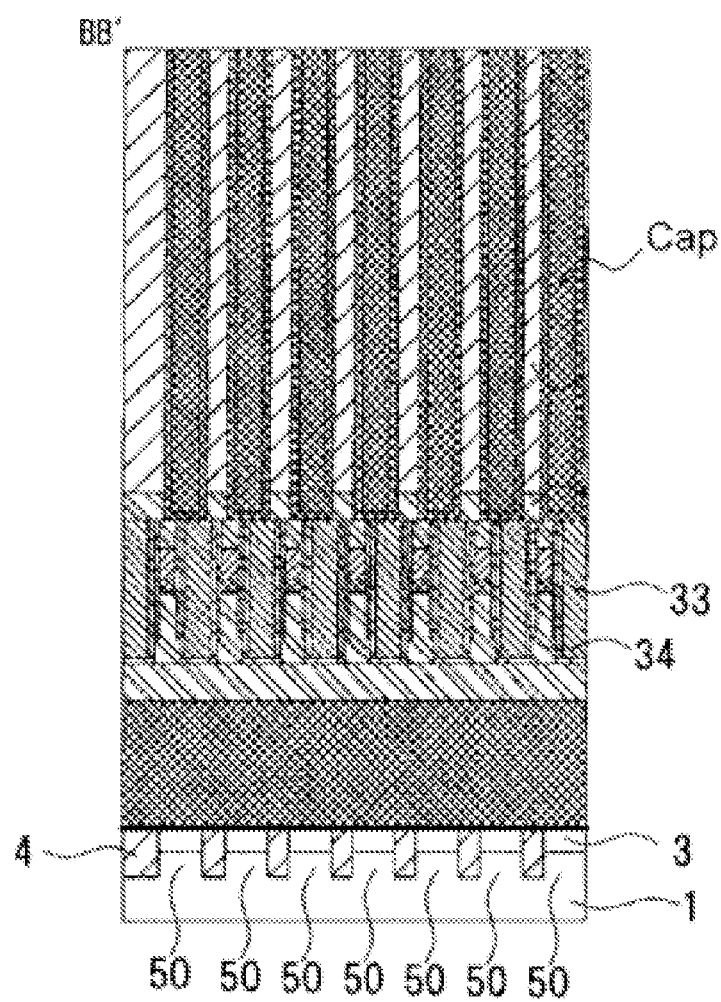
FIG. 2 is a cross-sectional view illustrating one example of a semiconductor device according to the present invention.

FIG. 1 is a drawing used to describe the structure of a semiconductor memory device (DRAM), which is one example of a semiconductor device according to the present invention. FIG. 1A is a plan view, FIG. 1B is a cross-sectional view of the semiconductor device illustrated in FIG. 1A, as cut along the line A-A', FIG. 1C is a cross-sectional view of the semiconductor device illustrated in FIG. 1A, as cut along the line C-C', and FIG. 2 is a cross-sectional view of the semiconductor device illustrated in FIG. 1A, as cut along the line B-B'. It should be noted that FIG. 1A illustrates only the main structure such as semiconductor pillars 1$b$1 to 1$b$3 and 1$b$1' to 1$b$3', gate electrodes 15 and second bit lines 24$a$, other structures being omitted. Further, the hatching used for each constituent element differs between FIG. 1A and FIGS. 1B, 1C and 2.

This semiconductor device ultimately functions as a DRAM, and each memory cell comprises a MOS transistor having a source region (second impurity-diffused region, first bit line) 3, a drain region (first impurity-diffused region) 40, a gate insulating film 14 and a gate electrode 15, and a capacitor Cap connected via a capacitive contact plug 33 to the drain region.

The semiconductor device comprises a plurality of groove portions for element isolation, extending as a whole in the X-direction (first direction) and formed by engraving a semiconductor substrate 1, a plurality of element isolation regions (STI: Shallow Trench Isolation) 4 formed by embedding an element isolation insulating film into the groove portions for element isolation, and a plurality of element-forming regions 50 formed between adjacent element isolation regions 4. The semiconductor substrate 1 comprises a substrate containing a prescribed concentration of an impurity, for example a single-crystal p-type silicon substrate. The element isolation regions 4 within the plane of the semiconductor substrate 1 are regions known as STIs (Shallow Trench Isolations), sections thereof extending in the X-direction (first direction). The element-forming regions 50 are active regions insulated and isolated by means of the element isolation regions 4. The element-forming regions 50 are isolated in the Y-direction (second direction) by means of the element isolation regions 4. The element-forming regions 50 comprise a horizontal active region 50$a$ forming a horizontal section extending in the X-direction (first direction) as seen in plan view, and an oblique active region 50$b$ forming an oblique section. As illustrated in FIG. 1A, the plurality of element-forming regions 50 are disposed side by side in the Y-direction (second direction) which is perpendicular to the X-direction (first direction).

As illustrated in FIG. 1C, a plurality of semiconductor pillars are provided in the element-forming region 50, upright relative to the main surface of the semiconductor substrate 1, side by side in the X-direction (first direction). To elaborate, first semiconductor pillars 1b1, second semiconductor pillars 1b2, third semiconductor pillars 1b3, third semiconductor pillars 1b3', second semiconductor pillars 1b2' and first semiconductor pillars 1b1' are disposed side by side, successively from the left side toward the right side in the X-direction (first direction). The first semiconductor pillars 1b1, the second semiconductor pillars 1b2 and the third semiconductor pillars 1b3 form one set of semiconductor pillars, and the first semiconductor pillars 1b1', the second semiconductor pillars 1b2' and the third semiconductor pillars 1b3' form another set of semiconductor pillars. Two sets of semiconductor pillars (six semiconductor pillars in total) are provided in the one horizontal active region 50a illustrated in FIG. 1A. The first to third semiconductor pillars 1b1 to 1b3 and 1b1' to 1b3' provided in each horizontal active region 50a are respectively disposed side by side in the Y-direction (second direction), which is perpendicular to the X-direction (first direction). To elaborate, the first semiconductor pillars 1b1 are disposed side by side in a linear fashion with an equal pitch spacing in the second direction, with element isolation regions 4 interposed therebetween; the second semiconductor pillars 1b2 are disposed side by side in a linear fashion with an equal pitch spacing in the second direction, with element isolation regions 4 interposed therebetween; and the third semiconductor pillars 1b3 are disposed side by side in a linear fashion with an equal pitch spacing in the second direction, with element isolation regions 4 interposed therebetween. Similarly, the first semiconductor pillars 1b1' are disposed side by side in a linear fashion with an equal pitch spacing in the second direction, with element isolation regions 4 interposed therebetween; the second semiconductor pillars 1b2' are disposed side by side in a linear fashion with an equal pitch spacing in the second direction, with element isolation regions 4 interposed therebetween; and the third semiconductor pillars 1b3' are disposed side by side in a linear fashion with an equal pitch spacing in the second direction, with element isolation regions 4 interposed therebetween.

In the cross-section illustrated in FIG. 1B, bit contacts 19 are provided on both sides, in the X-direction (first direction), of the six semiconductor pillars, in such a way that they are side by side with the six semiconductor pillars, electrically connecting the first bit lines 3 and the second bit lines 24a. The bit contacts 19 are provided on the oblique active regions 50b. As discussed hereinbelow, because the element-forming regions 50 form a snaking pattern, element isolation regions 4 appear on both sides, in the X-direction, of the bit contacts 19 in the A-A' cross-section. Further, the first bit lines 3 are disposed following the shape, as seen in plan view, of the element-forming regions 50, below the semiconductor pillars.

As illustrated in FIGS. 1B and 1C, the width in the X-direction (first direction) of the respective gaps between the first semiconductor pillars 1b1 and the second semiconductor pillars 1b2 and between the first semiconductor pillars 1b1' and the second semiconductor pillars 1b2' is relatively large. Thus silicon nitride films (first embedded insulating films) 16 are provided between the first semiconductor pillars 1b1 and the second semiconductor pillars 1b2, and between the first semiconductor pillars 1b1' and the second semiconductor pillars 1b2', with the interposition of the gate insulating films 14 and the gate electrodes 15, which are provided on the opposing side surfaces, in the X-direction, of each semiconductor pillar. On the other hand, the width in the X-direction (first direction) of the respective gaps between the second semiconductor pillars 1b2 and the third semiconductor pillars 1b3 and between the second semiconductor pillars 1b2' and the third semiconductor pillars 1b3' is relatively small. Therefore silicon nitride films (second embedded insulating films) 13 are provided between the second semiconductor pillars 1b2 and the third semiconductor pillars 1b3, and between the second semiconductor pillars 1b2' and the third semiconductor pillars 1b3', in such a way as to come into contact with the opposing side surfaces, in the X-direction, of each semiconductor pillar. This prevents short-circuiting between the semiconductor pillars.

As illustrated in FIGS. 1B and C, the first bit lines 3 are formed by the second impurity-diffused regions, one end of which is in contact with the element isolation regions 4, and are provided in common directly below the semiconductor pillars 1b and the bit contacts 19 (in the lower portions of the element-forming regions 50). The first bit lines 3 therefore have a snaking pattern. The first bit lines 3 are connected by way of the bit contacts 19, illustrated in FIG. 1B, to the low-resistance second bit lines 24a provided on the upper surface of the semiconductor substrate 1. The first bit lines 3 are formed in a snaking pattern, but the second bit lines 24a are formed in a straight-line pattern which extends in the X-direction (first direction) and comprise a titanium nitride film 20 and a tungsten film (metal layer) 24. In this mode of embodiment, the first bit lines 3 are shared by the MOS transistors (vertical transistors) provided in one horizontal active region 50a and function as source regions (second impurity-diffused regions). Silicon nitride films 22 are provided on the second bit lines 24a.

Trenches 8a extending in the Y-direction, perpendicularly intersecting the X-direction (first direction), are formed in locations that are shallower than the first bit lines 3 in the semiconductor substrate 1. The trenches 8a comprise the mutually opposing side surfaces of the two adjacent semiconductor pillars 1b1 and 1b2, and the two adjacent semiconductor pillars 1b1' and 1b2', and the main surface of the semiconductor substrate 1 located between the two semiconductor pillars. First gate electrodes 15 are formed, with the interposition of the first gate insulating films 14, on sidewalls of the trenches 8a, in other words on one side surface parallel to the Y-direction (second direction) of the first semiconductor pillars 1b1 and 1b1'. The first gate electrodes 15 function as word lines. The first gate electrodes 15 are formed in such a way that they extend in the Y-direction (second direction), and have an upper end in a location that is lower than the open end of the trenches 8a, in other words lower than the surface of the semiconductor substrate 1 (the upper surfaces of the first semiconductor pillars 1b1 and 1b1'). Similarly, second gate electrodes 15 are formed, with the interposition of the second gate insulating films 14, on one side surface parallel to the Y-direction (second direction) of the second semiconductor pillars 1b2 and 1b2'. The second gate electrodes 15 function as word lines. The second gate electrodes 15 are formed in such a way that they extend in the Y-direction (second direction), and have an upper end in a location that is lower than the open end of the trenches 8a, in other words lower than the surface of the semiconductor substrate 1 (the upper surfaces of the first semiconductor pillars 1b2 and 1b2'). The first gate electrodes 15 extend continuously in the Y-direction (second direction) in such a way as to be in common contact with the first gate insulating films 14 on the side surfaces of the first semiconductor pillars 1b1 that are disposed side by side in the Y-direction. Further, the second gate electrodes 15 extend continuously in the Y-direction (second direction) in such a way as to be in common contact with the second gate insulating films 14 on the side surfaces of the second semiconductor pillars 1b2 that are disposed side by side in the Y-direction.

This vertical transistor has what is known as a single-gate construction in which one gate electrode 15 opposes one of the side surfaces of a semiconductor pillar, with the interposition of the gate insulating film 14. Therefore in this mode of embodiment, the semiconductor pillars 1b1 to 1b3 and 1b1' to 1b3' forming the vertical transistors have a configuration in which, of the two side surfaces which face each other in the X-direction, one side surface is surrounded by the gate electrode 15, with the interposition of the gate insulating film 14, and the other side surface is surrounded by the insulating film 13 or 16, which are silicon nitride films. Further, the gate electrode 15 on the side surface of the semiconductor pillar 1b functions as the gate electrode of a switching transistor which allows conduction between the first bit line 3 and the drain region which is connected to the capacitor Cap.

In this mode of embodiment an example has been described in which a total of six semiconductor pillars (two sets of first to third semiconductor pillars) are disposed in the horizontal active regions 50a, but the number of semiconductor pillars is not limited to six. 3N (where N is a natural number) semiconductor pillars (a plurality of sets of semiconductor pillars) can be provided in the horizontal active regions 50a.

As illustrated in FIG. 2, in the semiconductor device according to this mode of embodiment, element-forming regions 50 and element isolation regions 4 are disposed alternately in the Y-direction (B-B' direction), the element-forming regions 50 being isolated in the Y-direction (second direction) by means of the element isolation regions 4. A plurality of capacitors Cap connected to the drain regions (which are not shown in FIG. 2) of each vertical transistor via the capacitative contact plugs 33 are provided. The capacitative contact plugs 33 are insulated and isolated by means of SOD films 27 (which are not shown in FIG. 2), silicon nitride films 34 and the like. The capacitors Cap are formed by successively laminating a lower electrode film, a capacitative insulating film and an upper electrode film, but the detailed structure is omitted from FIG. 2. It should be noted that the structure of the capacitors Cap may differ from that shown in the drawings, and there is no particular restriction to the structure.

In this semiconductor device, one memory cell is formed from the vertical transistor and the capacitor Cap discussed hereinabove. A plurality of such memory cells are disposed side by side in a matrix formation, extending in the X-direction and the Y-direction, within the plane of the element-forming region 50. It should be noted that in practice, multiple memory cells are formed side by side in the element-forming region 50 described hereinabove, but because it would be difficult to depict all of these memory cells in the semiconductor device illustrated in FIG. 1, for convenience the drawing illustrates schematically a situation in which the number of memory cells in the element-forming region 50 has been reduced.

As described hereinabove, in the semiconductor device according to this mode of embodiment, one horizontal active region 50a can be provided with a total of six vertical transistors. Further, bit contacts 19 electrically connecting the first bit lines 3 and the second bit lines 24a can be disposed on the oblique active regions 50b. It is thus not necessary to reserve an extra region for the bit contacts 19. As a result, it is possible to provide a semiconductor device which supports miniaturization.

(Method of Manufacturing Semiconductor Device)

A method of manufacturing the semiconductor device in FIGS. 1 and 2 will next be described with reference to FIG. 3 to FIG. 24. It should be noted that in the following description, descriptions of parts that are the same as in the semiconductor device described above are omitted, and the same reference codes are appended in the drawings.

Figure 3:
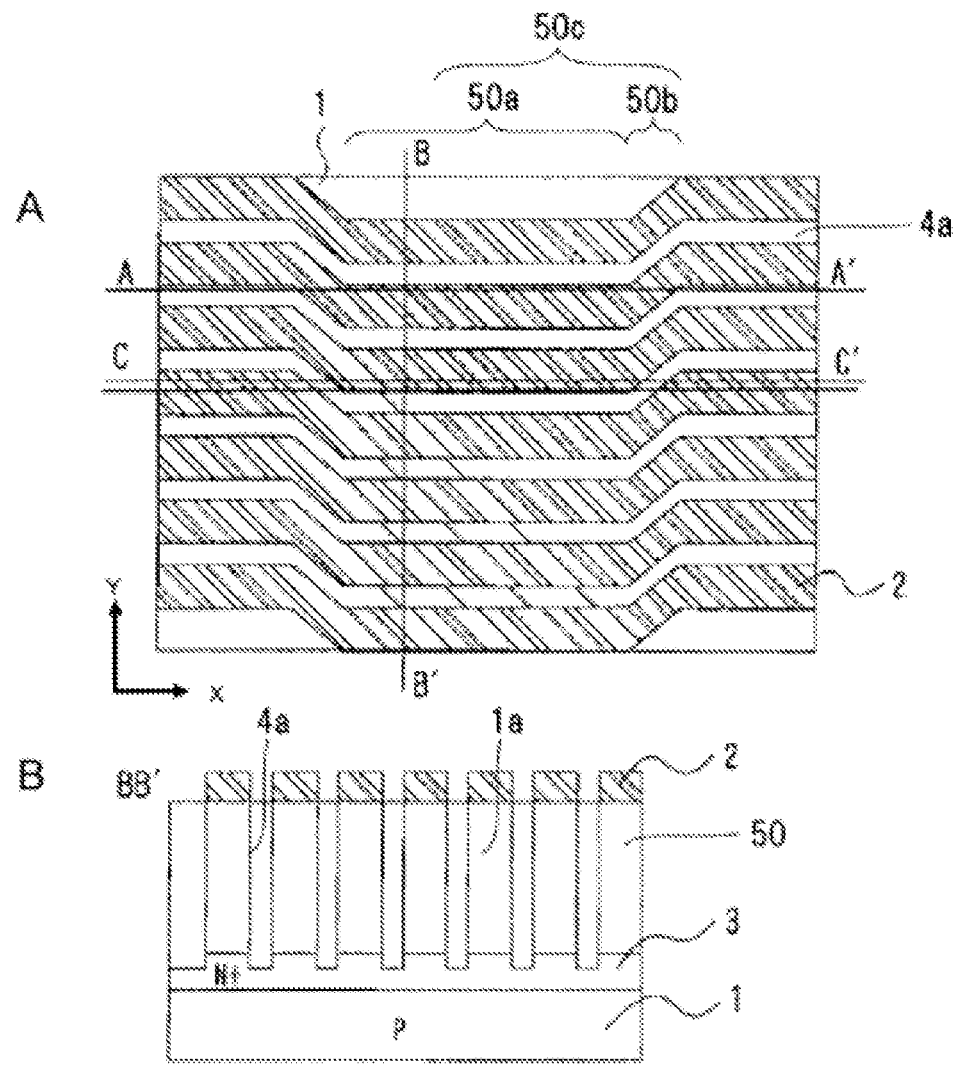
FIG. 3 is a drawing used to describe a process in the manufacture of the semiconductor device illustrated in FIG. 1.
Figure 4:
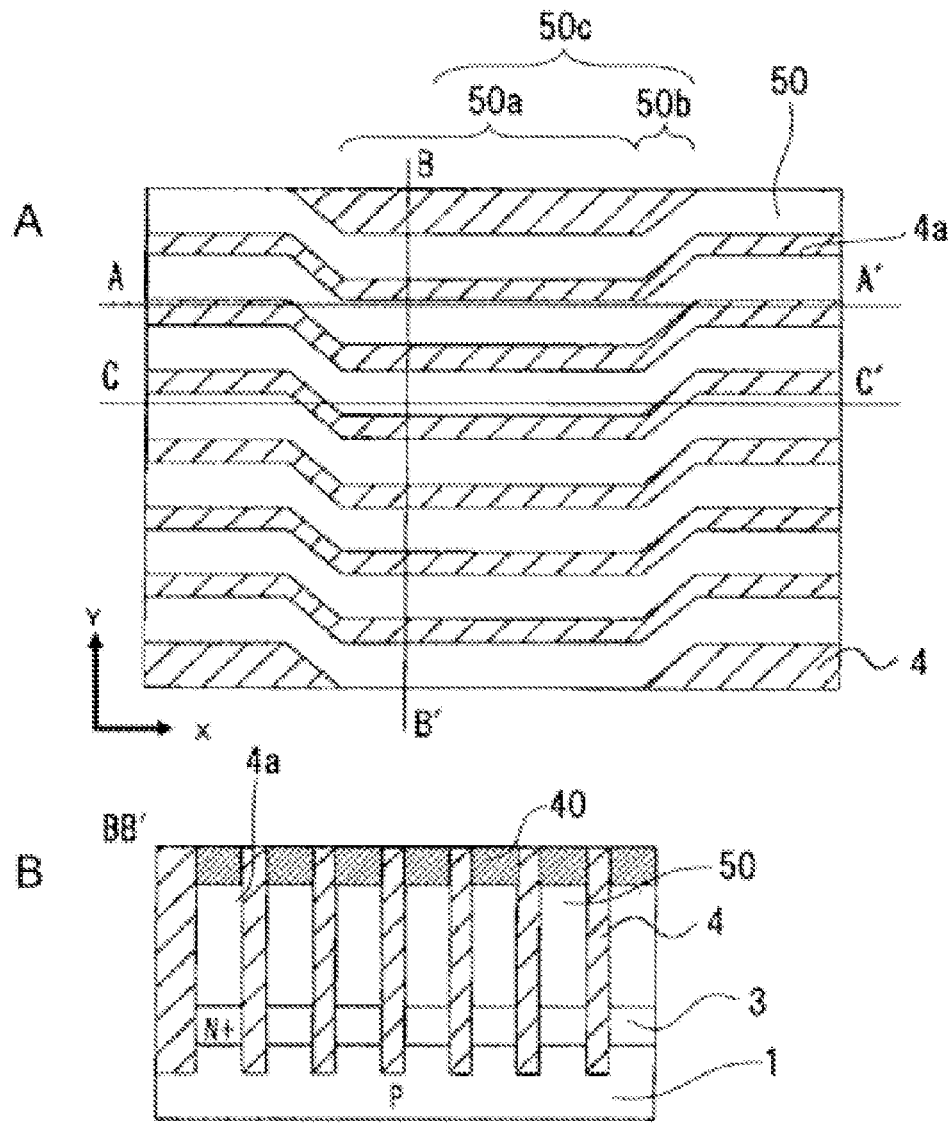
FIG. 4 is a drawing used to describe a process in the manufacture of the semiconductor device illustrated in FIG. 1.

FIG. 3A is a plan view, and FIG. 3B is a cross-sectional view along the line B-B' in FIG. 3A. First, as illustrated in FIG. 3, the p-type semiconductor substrate 1 is prepared, and a silicon nitride film 2 is deposited onto the semiconductor substrate 1. An element isolation region pattern having a plurality of openings extending as a whole in the X-direction (first direction) is then formed in the silicon nitride film 2 by photolithography and dry etching. The element isolation region pattern is a snaking pattern. Employing the patterned silicon nitride film 2 as a mask, dry etching is used to form element isolation grooves 4a in a snaking pattern in the semiconductor substrate 1. The element isolation grooves have a depth of 150 nm and a width of 20 nm, for example. By forming the element isolation grooves 4a, semiconductor plates 1a are formed between adjacent element isolation grooves 4a. The semiconductor plates 1a form the element-forming regions 50.

In one element-forming region 50, a unit active region 50c comprises a combination of a horizontal active region 50a which extends in the X-direction, and an oblique active region 50b which is oblique relative to the X-direction. In this mode of embodiment, the width of the horizontal active region 50a in the Y-direction is 30 nm. In one element-forming region 50, the shapes of adjacent unit active regions 50c are inverted in the Y-direction (the direction perpendicular to the X-direction), and said unit active regions 50c are connected together and are disposed repeatedly in the X-direction. Therefore one element-forming region 50 has a configuration in which horizontal active regions 50a are located at fixed intervals in the X-direction, centered around and on opposite sides of a line (corresponding to the line A-A') joining the center points of the oblique active regions 50b. Therefore the element-forming regions 50 have the same snaking pattern as the element isolation region pattern. To put this another way, in order for the element-forming regions 50 to be configured with a snaking pattern, the element isolation region pattern is formed as a snaking pattern. In this mode of embodiment, the element-forming region 50 must be formed with a snaking pattern.

Next, as illustrated in FIG. 3B, an impurity is implanted over the entire surface, using the silicon nitride film 2 as a mask, to form the second impurity-diffused region 3 in the bottom portions of the element isolation grooves 4a. More specifically, for example, an n-type diffusion region 3 is formed by implanting arsenic as the impurity, using an energy of 5 KeV, and then employing lamp annealing to cause the impurity that has been implanted into the bottom portions of the element isolation grooves 4a to diffuse toward the center of the semiconductor plates 1a. By this means, a bit line (first bit line) comprising the n-type diffusion region 3 is formed directly below the semiconductor plates 1a. It should be noted that in this mode of embodiment, the width of the horizontal active regions 50a in the Y-direction is 30 nm, and the width of the oblique active regions 50b in the Y-direction is also substantially the same. Thus the n-type diffusion region 3 is formed over the entire surface as seen in plan view, directly below the horizontal active regions 50a and the oblique active regions 50b. Further, the first bit lines 3 are formed following the shape of the semiconductor plates 1a, which have a snaking pattern, and therefore the first bit lines 3 have the same snaking pattern.

FIG. 4A is a plan view, and FIG. 4B is a cross-sectional view along the line B-B' in FIG. 4A. Next, as illustrated in FIG. 4B, the element isolation grooves 4a are engraved further to a depth of 250 nm by dry etching the semiconductor substrate 1 using the silicon nitride film 2 (which is not shown in the drawing) as a mask. A silicon dioxide film is then formed by CVD so as to fill the element isolation regions 4a, to form STIs (Shallow Trench Isolations; element isolation regions) 4. By this means, the n-type diffusion layer 3 is insulated and isolated in the Y-direction by means of the STIs 4, to form the first bit lines, provided individually for each semiconductor plate 1a extending in the X-direction. The silicon nitride film 2 is then removed by CMP and wet etching. By forming the element isolation regions 4, the element-forming regions 50 are formed between element isolation regions 4 that are adjacent to each other in the Y-direction. In one element-forming region 50, a unit active region 50c comprises a combination of a horizontal active region 50a which extends in the X-direction, and an oblique active region 50b which is oblique relative to the X-direction. An impurity is then implanted over the entire surface to form the first impurity-diffused regions 40 in the upper portions of the element-forming regions 50. More specifically, for example, after the impurity has been implanted under the same conditions as for the second impurity-diffused region, the impurity is thermally diffused by lamp annealing to form the first impurity-diffused regions 40.

Figure 5:
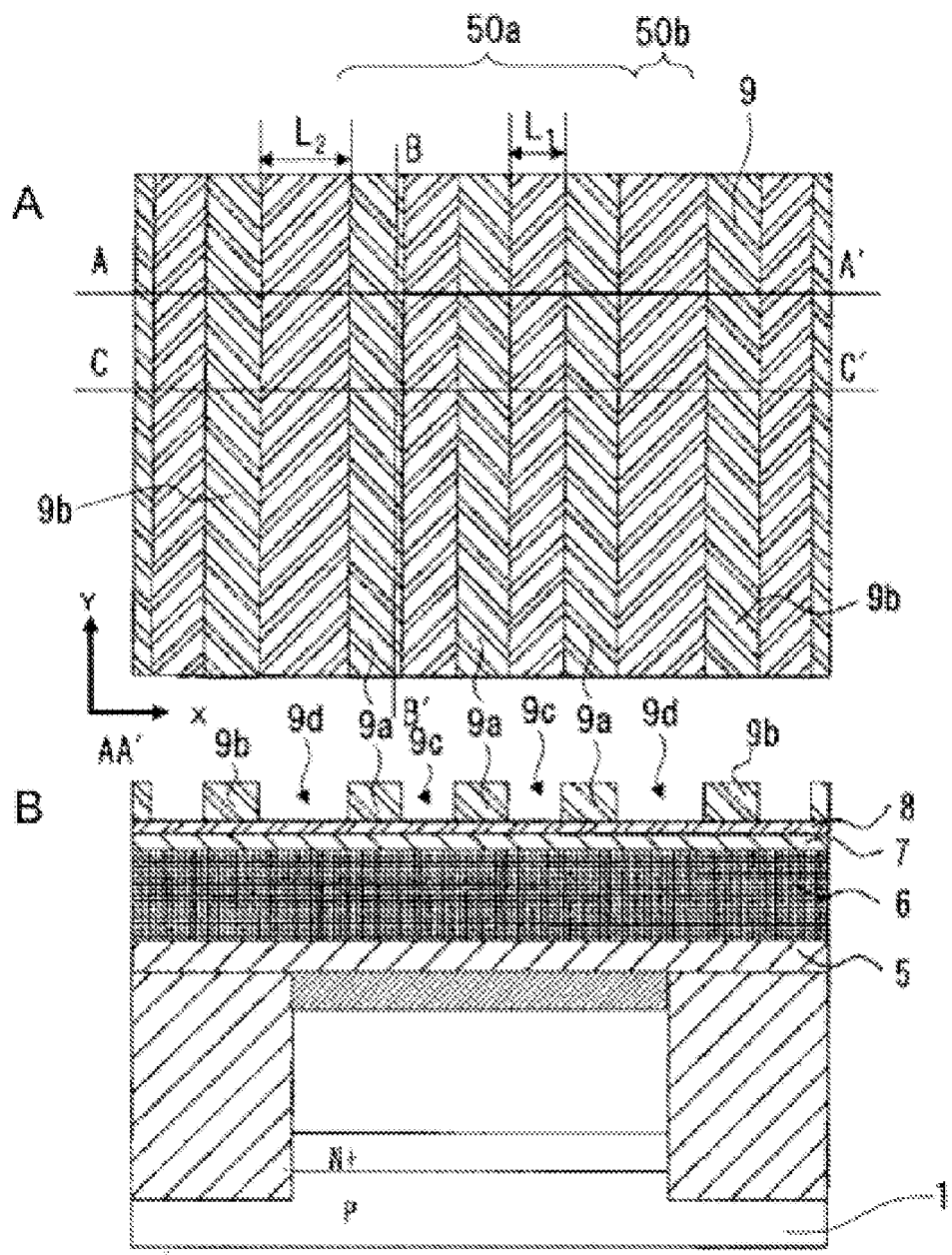
FIG. 5 is a drawing used to describe a process in the manufacture of the semiconductor device illustrated in FIG. 1.

FIG. 5A is a plan view, and FIG. 5B is a cross-sectional view along the line A-A' in FIG. 5A. Next, as illustrated in FIG. 5, a silicon dioxide film 5, an amorphous carbon film 6, a silicon nitride film 7, an amorphous silicon film 8 and a silicon nitride film 9 are formed on the semiconductor substrate 1 by CVD. Next a pattern of grooves for forming word lines, having a plurality of openings extending in a straight line in the Y-direction, is formed in the silicon nitride film 9 by photolithography and dry etching. This yields a straight-line pattern of silicon nitride films 9a and 9b having a width of 60 nm and extending in the Y-direction. It should be noted that at this time, the silicon nitride film patterns 9a provided above the horizontal active regions 50a in such a way that they intersect the horizontal active regions 50a are provided in such a way that gaps L1 in the X-direction between the silicon nitride film patterns 9a are equal to each other. In other words, the width in the X-direction of recessed portions 9c formed by adjacent patterns 9a and the amorphous silicon film 8 is L1. On the other hand, the silicon nitride film patterns 9b provided above the oblique active regions 50b in such a way that they intersect the oblique active regions 50b are provided in such a way that gaps L2 in the X-direction between the silicon nitride film patterns 9b and adjacent silicon nitride film patterns 9a are wider than L1. In other words, the width in the X-direction of recessed portions 9d formed by adjacent patterns 9a and 9b and the amorphous silicon film 8 is L2, where L2>L1.

Figure 6:
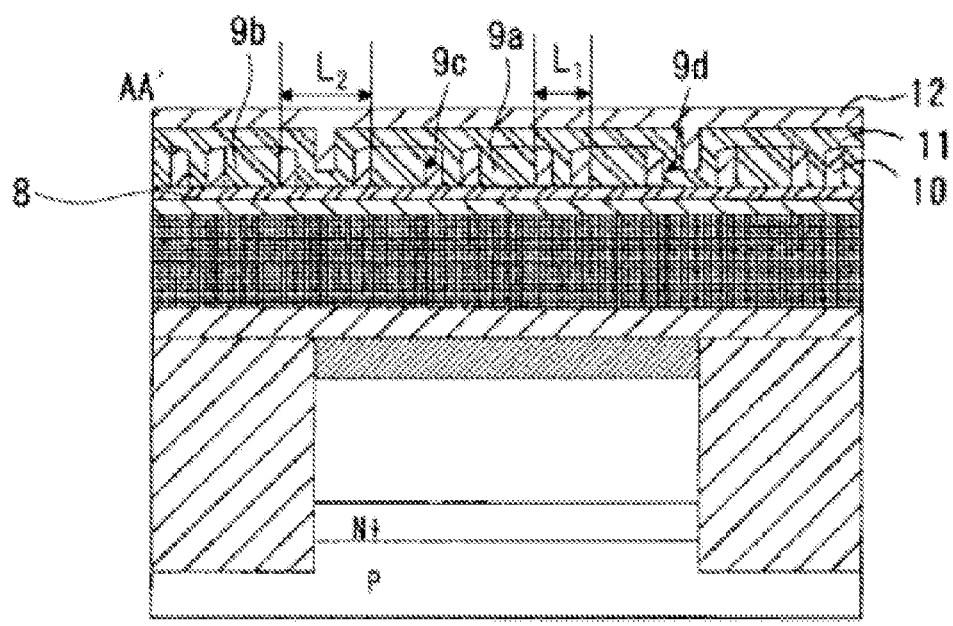
FIG. 6 is a drawing used to describe a process in the manufacture of the semiconductor device illustrated in FIG. 1.

FIG. 6 is a cross-sectional view corresponding to a cross-section in the direction A-A' in FIG. 5A. As illustrated in FIG. 6, a silicon dioxide film 10 having a thickness of 20 nm is deposited by CVD on the amorphous silicon film 8 such that it covers the silicon nitride film patterns 9a and 9b. The silicon dioxide film 10 is then etched back by dry etching to form side walls comprising the silicon dioxide film 10 on both side surfaces (on the inside surfaces of the recessed portions 9c and 9d) of the silicon nitride film patterns 9a and 9b, where said side surfaces are parallel to the Y-direction. A silicon nitride film 11 and a silicon dioxide film 12 are deposited successively by CVD onto the amorphous silicon film 8. At this time, because, as discussed hereinabove, the width L2 of the recessed portions 9d is greater than the width L1 of the recessed portions 9c, the recessed portions 9c are completely filled with the silicon nitride film 11, whereas the recessed portions 9d are not completely filled by the silicon nitride film 11, but are filled with the silicon nitride film 11 and the silicon dioxide film 12.

Figure 7:
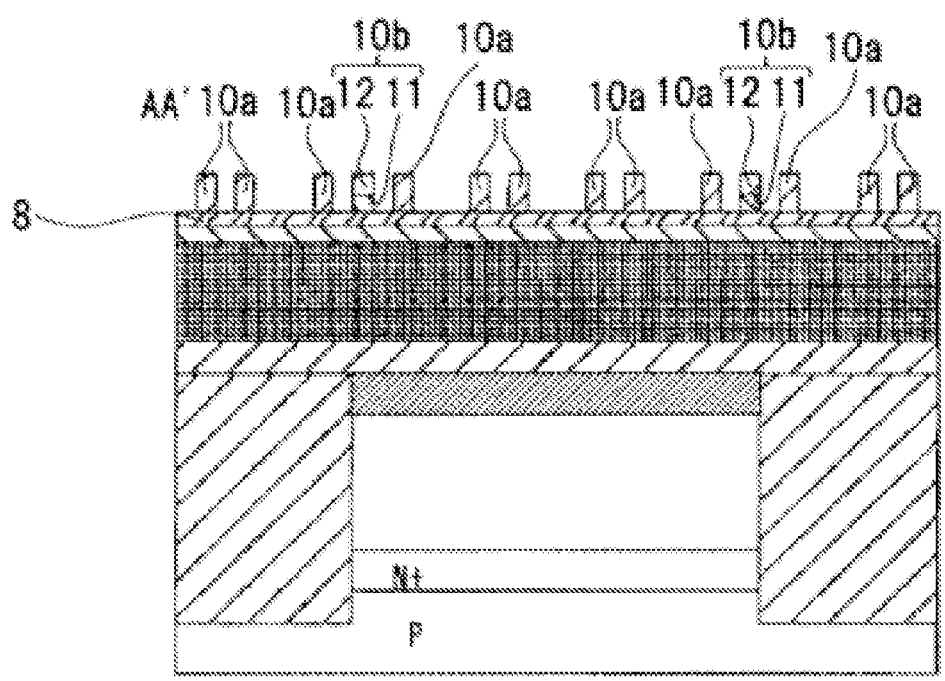
FIG. 7 is a drawing used to describe a process in the manufacture of the semiconductor device illustrated in FIG. 1.

FIG. 7 is a cross-sectional view corresponding to a cross-section in the direction A-A' in FIG. 5A. As illustrated in FIG. 7, the silicon dioxide film 12 is removed by CMP or by etching back until the surface of the silicon nitride film 11 is exposed. The silicon nitride films 9 and 11 are then removed by etching. This yields straight-line patterns extending in the Y-direction on the amorphous silicon film 8. It should be noted that the straight-line patterns 10a provided as the side walls of the silicon nitride film patterns 9a are formed from the silicon dioxide film 10, but the straight-line patterns 10b formed in the center, in the X-direction, of the recessed portions 9d are formed from an upper portion comprising the silicon dioxide film 12 and a lower portion comprising the silicon nitride film 11.

Figure 8:
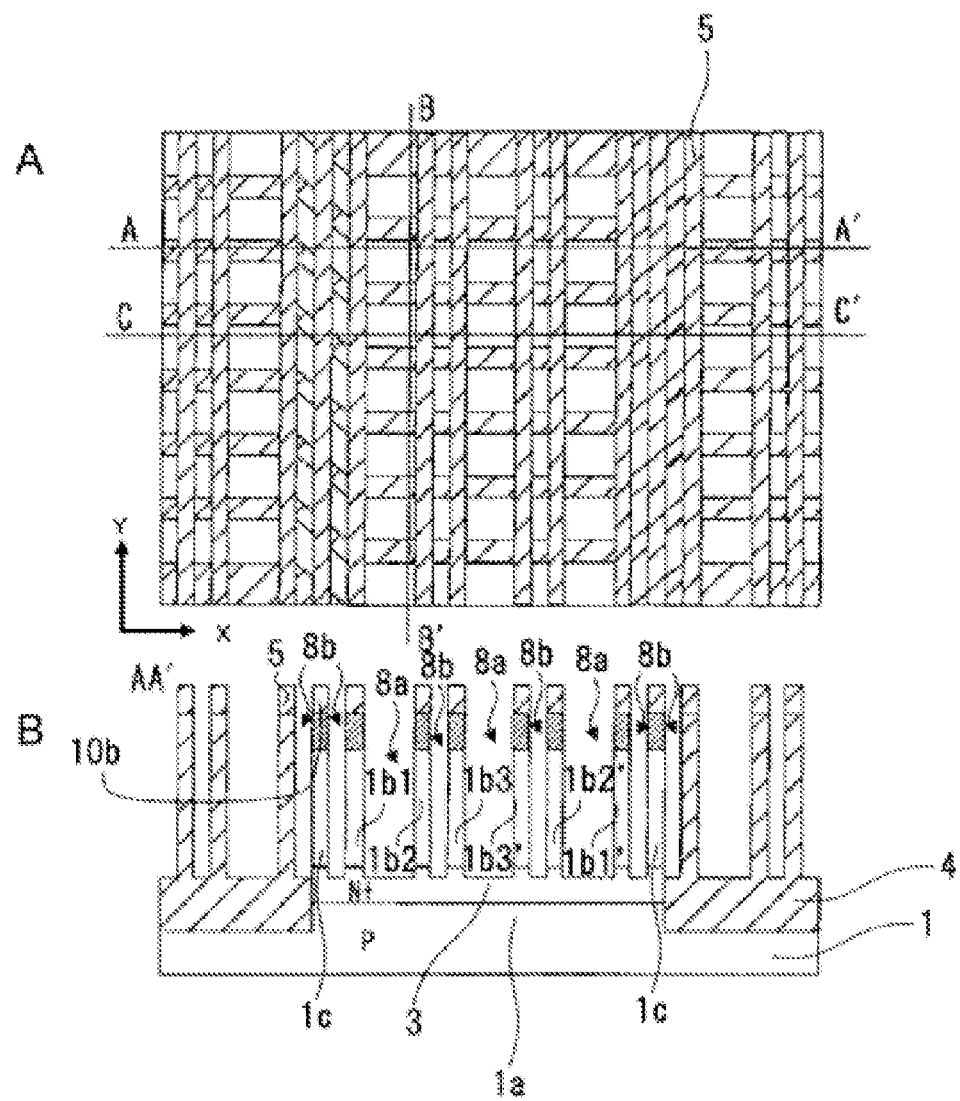
FIG. 8 is a drawing used to describe a process in the manufacture of the semiconductor device illustrated in FIG. 1.

FIG. 8A is a plan view, and FIG. 8B is a cross-sectional view along the line A-A' in FIG. 8A. Next, as illustrated in FIG. 8, a hard mask pattern is formed by successively processing the amorphous silicon film 8 and the silicon nitride film 7 (neither of which is shown in the drawings) by dry etching using the straight-line patterns 10a and 10b (neither of which is shown in the drawings). By dry etching the amorphous carbon film 6 (which is not shown in the drawings) using the hard mask pattern, the hard mask pattern is transferred to the amorphous carbon film 6. Then, by successively dry etching the silicon dioxide film 5, the semiconductor substrate 1 and the element isolation regions 4 using the amorphous carbon film 6 pattern as a mask, the trenches 8a for the word lines, extending in the Y-direction and communicating with the semiconductor plates 1a and the element isolation regions 4, are formed. By forming the trenches 8a, the semiconductor plate 1a is separated in the X-direction (first direction), to form, in succession from the left to the right in the X-direction, semiconductor pillars 1c, the first semiconductor pillars 1b1, the second semiconductor pillars 1b2, the third semiconductor pillars 1b3, the third semiconductor pillars 1b3', the second semiconductor pillars 1b2', the first semiconductor pillars 1b1' and semiconductor pillars 1c. Further, the first semiconductor pillars 1b1 are disposed side by side with an equal pitch spacing in the second direction, the second semiconductor pillars 1b2 are disposed side by side with an equal pitch spacing in the second direction, and the third semiconductor pillars 1b3 are disposed side by side with an equal pitch spacing in the second direction. Similarly, the first semiconductor pillars 1b1' are disposed side by side with an equal pitch spacing in the second direction, the second semiconductor pillars 1b2' are disposed side by side with an equal pitch spacing in the second direction, and the third semiconductor pillars 1b3' are disposed side by side with an equal pitch spacing in the second direction.

The trenches 8a are formed to a depth such that they do not penetrate through the first bit lines 3 in the depth direction. Here, if the trenches 8a are formed to a depth such that they penetrate through the first bit lines 3, then the first bit lines 3 which extend in a snaking pattern will be divided, and continuity will be lost. Moreover, trenches 8b having a width in the X-direction that is less than that of the trenches 8a are formed between adjacent trenches 8a. Further, the semiconductor pillars 1c are formed on both sides, in the X-direction, sandwiching the six semiconductor pillars 1b1 to 1b3 and 1b1' to 1b3' in FIG. 8B. As discussed hereinbelow, the semiconductor pillars 1c are removed in a subsequent process, and the bit contacts 19 are formed in these sections.

Figure 9:
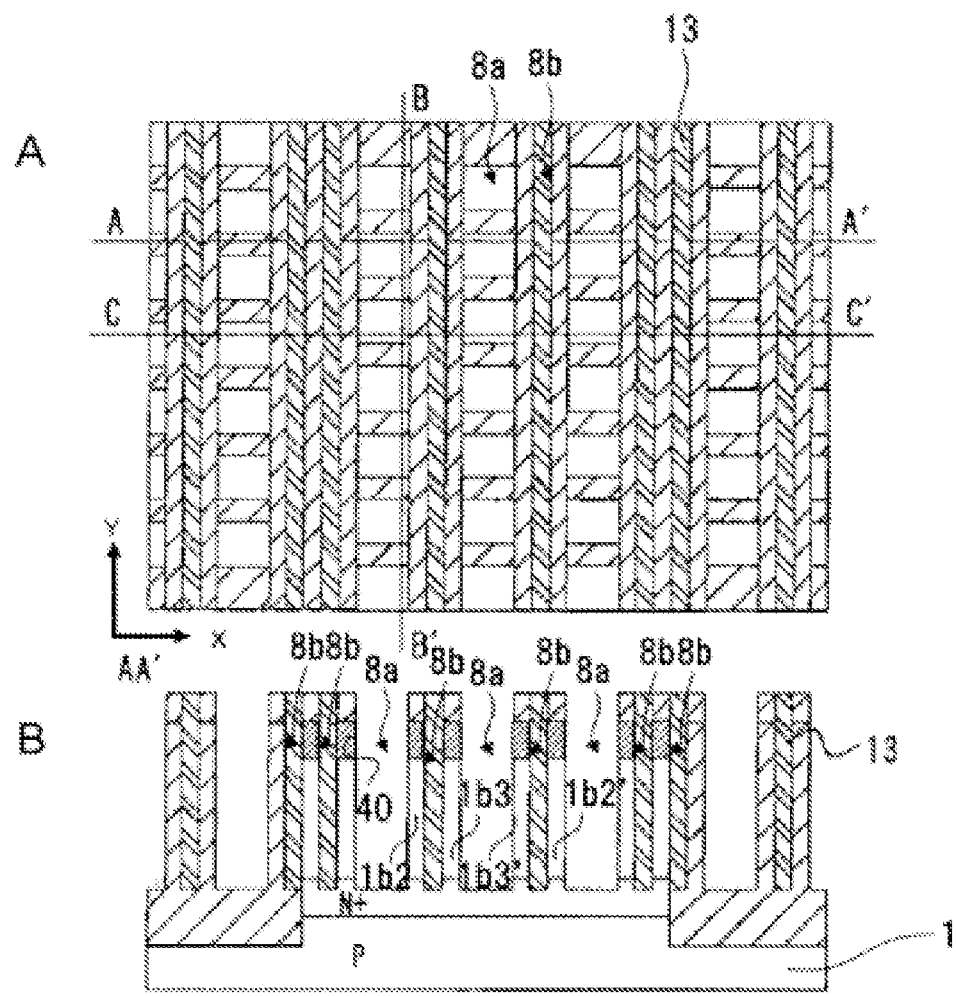
FIG. 9 is a drawing used to describe a process in the manufacture of the semiconductor device illustrated in FIG. 1.

FIG. 9A is a plan view, and FIG. 9B is a cross-sectional view along the line A-A' in FIG. 9A. Next, as illustrated in FIG. 9, a silicon nitride film (second embedded insulating film) 13 is formed by CVD over the entire surface of the semiconductor substrate 1, to a thickness (for example 15 nm) such that the trenches 8b are completely filled but the trenches 8a are not completely filled. Next, the silicon nitride film 13 embedded in the trenches 8a is removed by isotropic etching (wet etching). At this time, the silicon nitride film 13 in the trenches 8b is not removed, but remains in place. By this means, the silicon nitride film 13 is provided in such a way that it is in contact with the side surfaces, opposing each other in the X-direction, of the second semiconductor pillars 1b2 and the third semiconductor pillars 1b3, and the side surfaces, opposing each other in the X-direction, of the second semiconductor pillars 1b2' and the third semiconductor pillars 1b3'.

Figure 10:
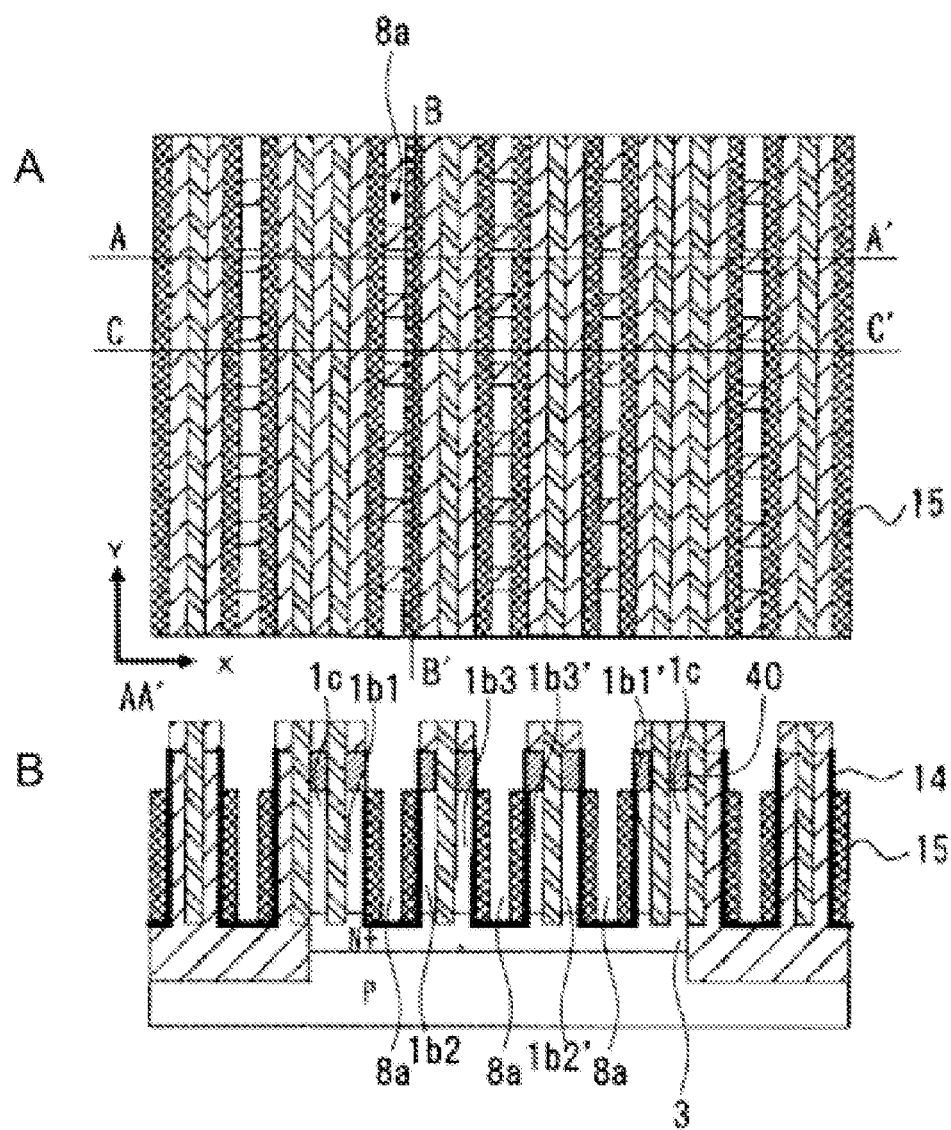
FIG. 10 is a drawing used to describe a process in the manufacture of the semiconductor device illustrated in FIG. 1.

FIG. 10A is a plan view, and FIG. 10B is a cross-sectional view along the line A-A' in FIG. 10A. Next, as illustrated in FIG. 10, the first and second gate insulating films 14 are formed on the side surfaces of the first to third semiconductor pillars 1b1 to 1b3 and 1b1' to 1b3', by lamp annealing. Next, a 20 nm titanium nitride film 15 is deposited over the entire surface by CVD, and the titanium nitride film 15 is etched back by dry etching, to form the first and second gate electrodes 15 which will become the word lines, in the shape of side walls on only the side surfaces of the trenches 8a, and lower than the depth of the trenches 8a. In this mode of embodiment, the first and second gate electrodes 15 have a construction in which they are formed only on one side surface, parallel to the Y-direction, of the semiconductor pillars. Vertical MOS transistors are thus formed, the first impurity-diffused regions 40 serving as drain regions, the first bit lines 3 serving as source regions, and the gate insulating films 14, the gate electrodes 15 and the semiconductor pillars serving as channels. These vertical MOS transistors function as switching transistors for connecting the capacitors Cap (which are not shown in the drawings) to the first bit lines 3.

Figure 11:
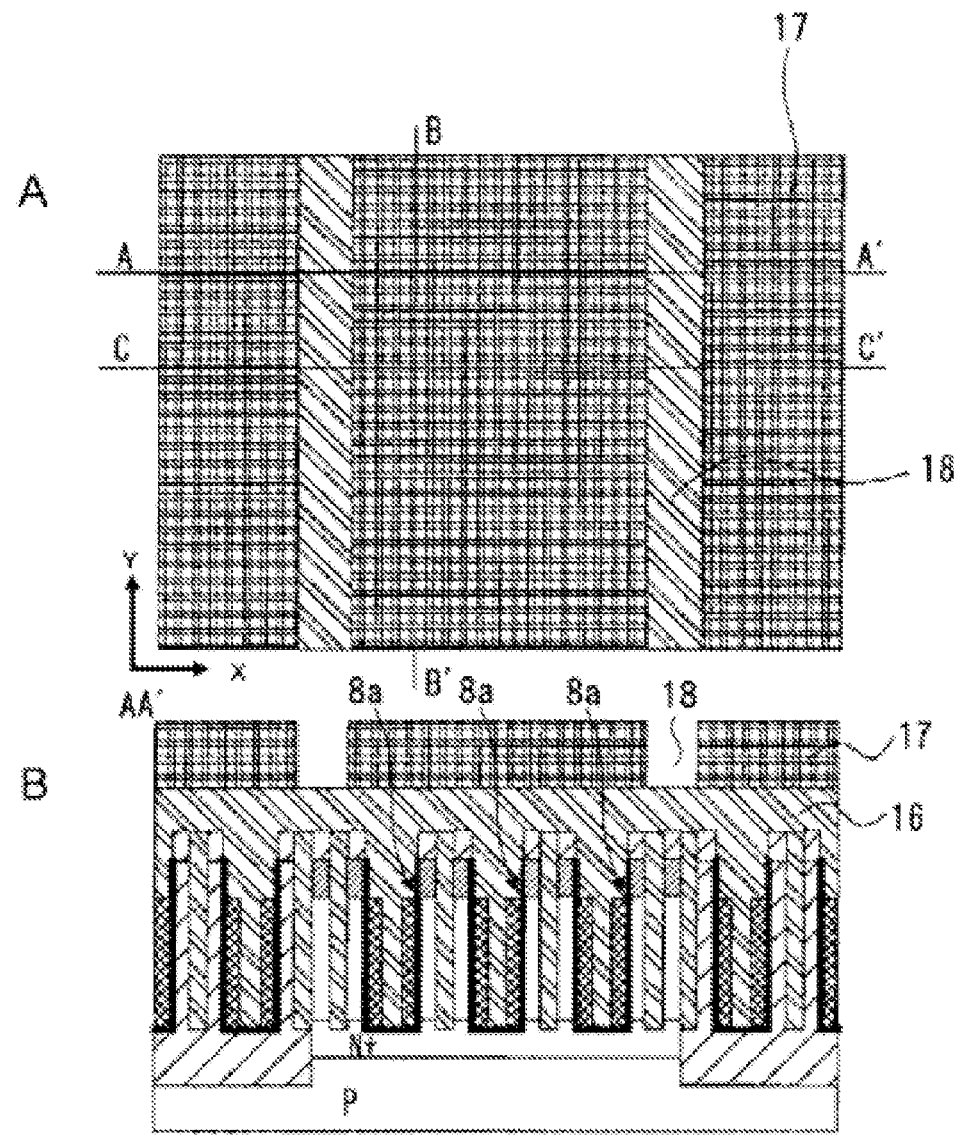
FIG. 11 is a drawing used to describe a process in the manufacture of the semiconductor device illustrated in FIG. 1.

FIG. 11A is a plan view, and FIG. 11B is a cross-sectional view along the line A-A' in FIG. 11A. Next, as illustrated in FIG. 11, the silicon nitride film (first embedded insulating film) 16 having a thickness of 30 nm is deposited by CVD so as to fill the trenches 8a, with the interposition of the first and second gate insulating films 14 and the first and second gate electrodes 15. A photoresist film 17 is formed on the silicon nitride film 16 by spin coating, after which a bit contact pattern 18 having a space width of 30 nm is formed in the photoresist film 17 by lithography.

Figure 12:
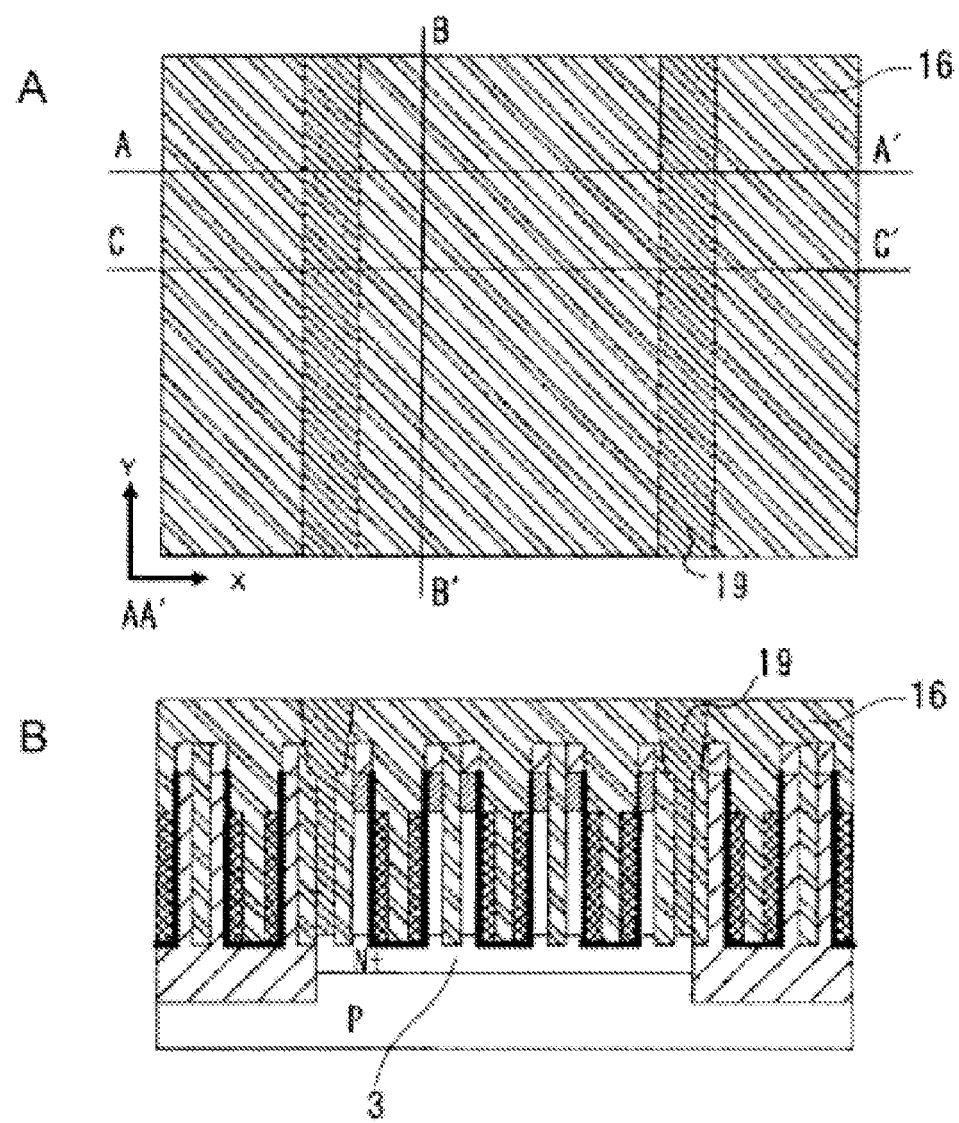
FIG. 12 is a drawing used to describe a process in the manufacture of the semiconductor device illustrated in FIG. 1.

FIG. 12A is a plan view, and FIG. 12B is a cross-sectional view along the line A-A' in FIG. 12A. Next, as illustrated in FIG. 12, bit contact holes are formed to expose the semiconductor pillars 1c (which are not shown in the drawings), by dry etching the silicon nitride film 16 using the photoresist film 17 (which is not shown in the drawings) as a mask. Next, after removing the photoresist film 17, the bit contact holes are formed to expose the first bit line 3, by additionally removing the semiconductor pillars 1c. A polysilicon film 19 doped with phosphorus is then formed over the entire surface so as to fill the bit contact holes. The polysilicon film 19 on the silicon nitride film 16 is removed by etch-back, thereby forming the bit contacts 19 which are electrically connected to the first bit lines 3.

Figure 13:
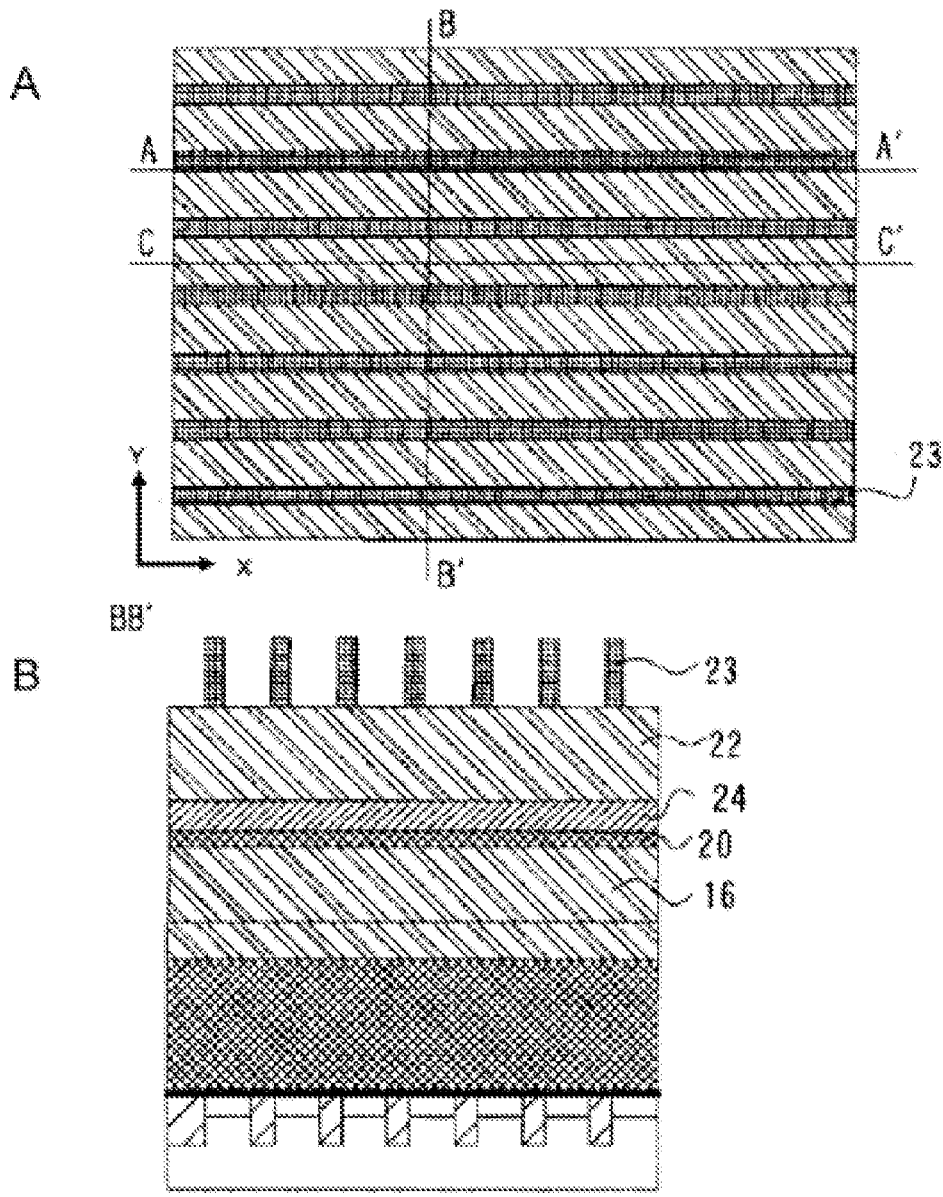
FIG. 13 is a drawing used to describe a process in the manufacture of the semiconductor device illustrated in FIG. 1.

FIG. 13A is a plan view, and FIG. 13B is a cross-sectional view along the line B-B' in FIG. 13A. Next, as illustrated in FIG. 13, a titanium nitride film 20 having a thickness of 5 nm and the tungsten film 24 having a thickness of 15 nm are deposited successively on the silicon nitride film 16 by sputtering. The silicon nitride film 22 having a thickness of 100 nm is formed on the tungsten film 24 by CVD. A photoresist film 23 is formed on the silicon nitride film 22 by spin coating, after which a second bit line pattern having a wiring line width of 20 nm is formed in the photoresist film 23 by lithography.

Figure 14:
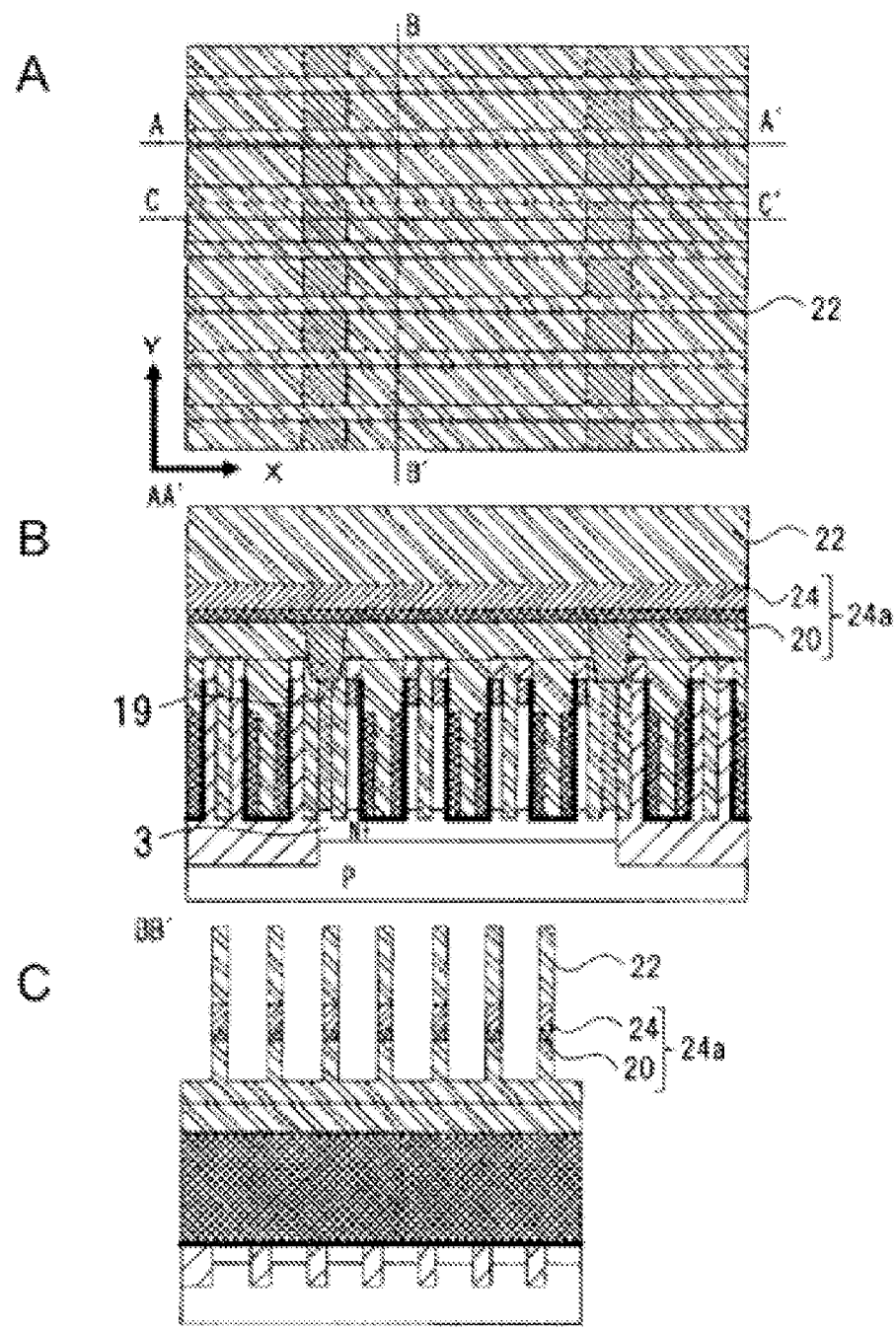
FIG. 14 is a drawing used to describe a process in the manufacture of the semiconductor device illustrated in FIG. 1.

FIG. 14A is a plan view, FIG. 14B is a cross-sectional view along the line A-A' in FIG. 14A, and FIG. 14C is a cross-sectional view along the line B-B' in FIG. 14A. Next, as illustrated in FIG. 14, a hard mask pattern comprising the silicon nitride film 22 is formed by dry etching the silicon nitride film 22 using the second bit line pattern 23 (which is not shown in the drawings). The tungsten film 24 and the titanium nitride film 20 are successively dry etched using the hard mask pattern 22 as a mask, thereby forming the second bit lines 24a comprising the tungsten film 24 and the titanium nitride film 20. The second bit lines 24a are formed in such a way that they extend in a straight line in the X-direction (first direction) and are connected via the bit contacts 19 to the first bit lines 3. The second bit lines 24a contain the low-resistance tungsten film (metal layer) 24, and therefore a low resistance can be achieved overall, making high-speed operation of the semiconductor device possible.

Figure 15:
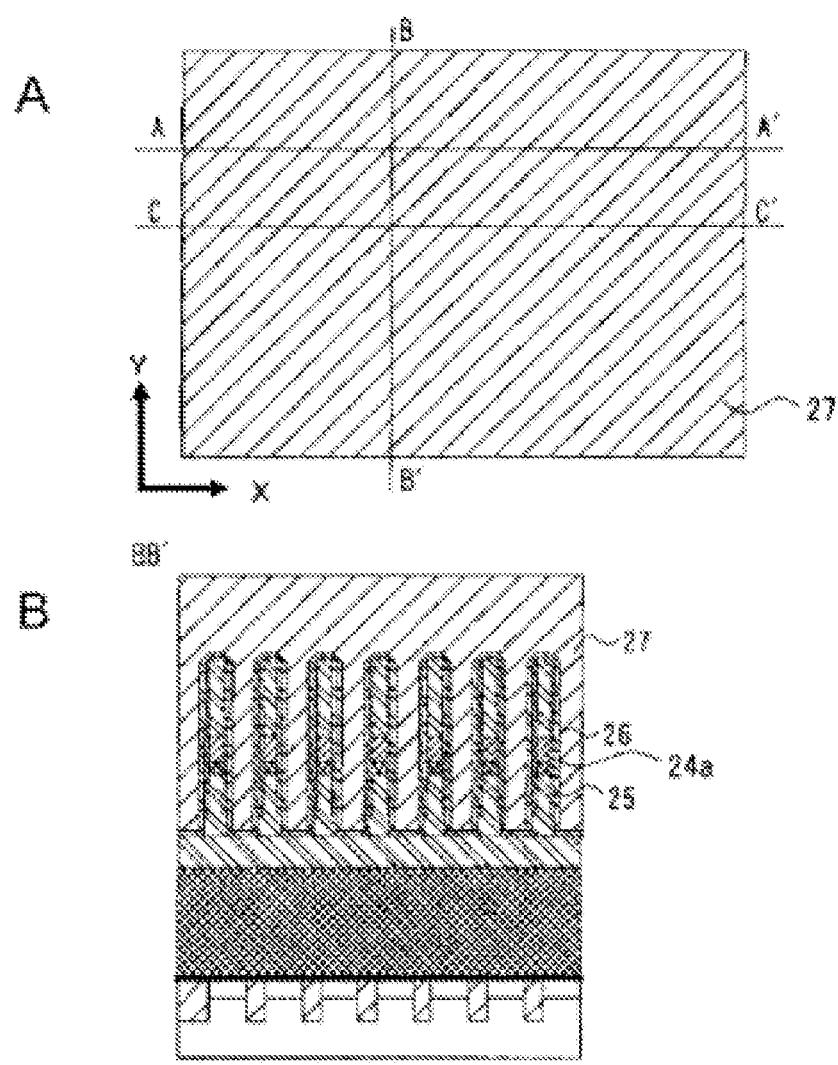
FIG. 15 is a drawing used to describe a process in the manufacture of the semiconductor device illustrated in FIG. 1.

FIG. 15A is a plan view, and FIG. 15B is a cross-sectional view along the line B-B' in FIG. 15A. Next, as illustrated in FIG. 15, the silicon nitride film 16 is additionally removed until the silicon dioxide film 5 is exposed. A silicon nitride film 25 having a thickness of 5 nm is deposited by CVD over the entire surface so as to cover the second bit lines 24a. The silicon nitride film 25 is then etched back to form side walls on the sidewalls of the second bit lines 24a. A silicon nitride film 26 having a thickness of 5 nm is deposited as a liner film by CVD over the entire surface so as to cover the second bit lines 24a. Further, a SOD (Spin On Dielectric) film 27 is deposited over the entire surface so as to cover the second bit lines 24a. Further, the surface of the SOD film 27 is planarized by CMP.

Figure 16:
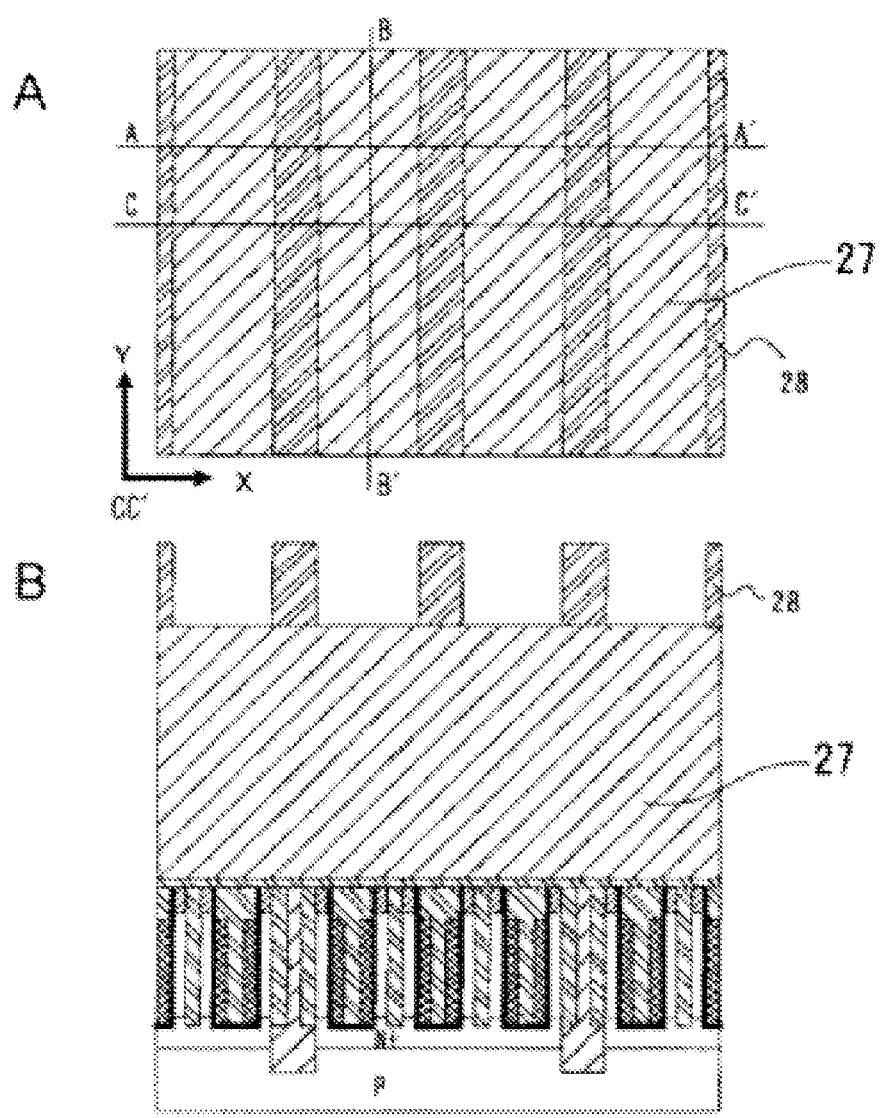
FIG. 16 is a drawing used to describe a process in the manufacture of the semiconductor device illustrated in FIG. 1.

FIG. 16A is a plan view, and FIG. 16B is a cross-sectional view along the line C-C' in FIG. 16A. Next, as illustrated in FIG. 16, an amorphous carbon film 28 having a thickness of 100 nm is deposited on the SOD film 27 by CVD. A photoresist film (which is not shown in the drawings) is formed on the amorphous carbon film 28, after which a photoresist pattern having a width of 45 nm is formed in the photoresist film by lithography. By dry etching the amorphous carbon film 28 using the photoresist pattern as a mask, the photoresist pattern is transferred to the amorphous carbon film 28.

Figure 17:
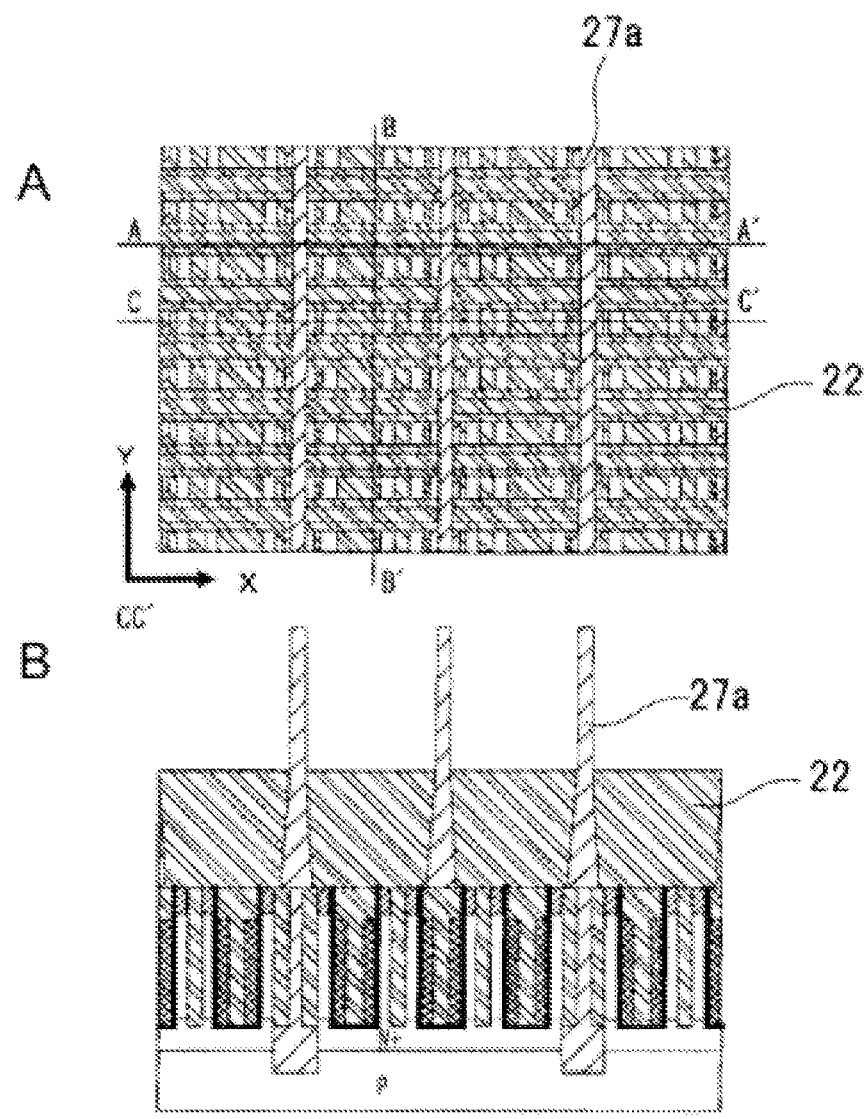
FIG. 17 is a drawing used to describe a process in the manufacture of the semiconductor device illustrated in FIG. 1.

FIG. 17A is a plan view, and FIG. 17B is a cross-sectional view along the line C-C' in FIG. 17A. Next, as illustrated in FIG. 17, the SOD film 27 is dry etched using the amorphous carbon film 28 (which is not shown in the drawings) as a mask. By this means, isolation-assisting insulating films 27a, comprising the SOD film in the shape of partitions extending in the Y-direction, are formed. In this mode of embodiment, the SOD film 27 comprises a silicon dioxide film, and the silicon nitride film 22 is provided on the second bit lines 24a (which are not shown in the drawings). Further, when the dry etching mentioned above is performed, the conditions are set such that the etching rate of the silicon dioxide film is higher than that of the silicon nitride film. Therefore the silicon nitride film 22 is not removed, even by the dry etching, but remains in place. This makes it possible for capacitive contact holes to be formed in a self-aligning manner. To elaborate, the capacitive contact holes are openings demarcated by the isolation-assisting insulating films 27a which extend in the Y-direction, and the silicon nitride films 22 and the second bit lines 24a located thereunder, which extend in the X-direction. It should be noted that, as discussed hereinabove, the silicon nitride films 25 and 26 (the side walls and the liner films) are provided on the sidewalls of the second bit lines 24a, and therefore short-circuiting does not occur between the second bit lines 24a and the capacitive contacts that are formed later.

Figure 18:
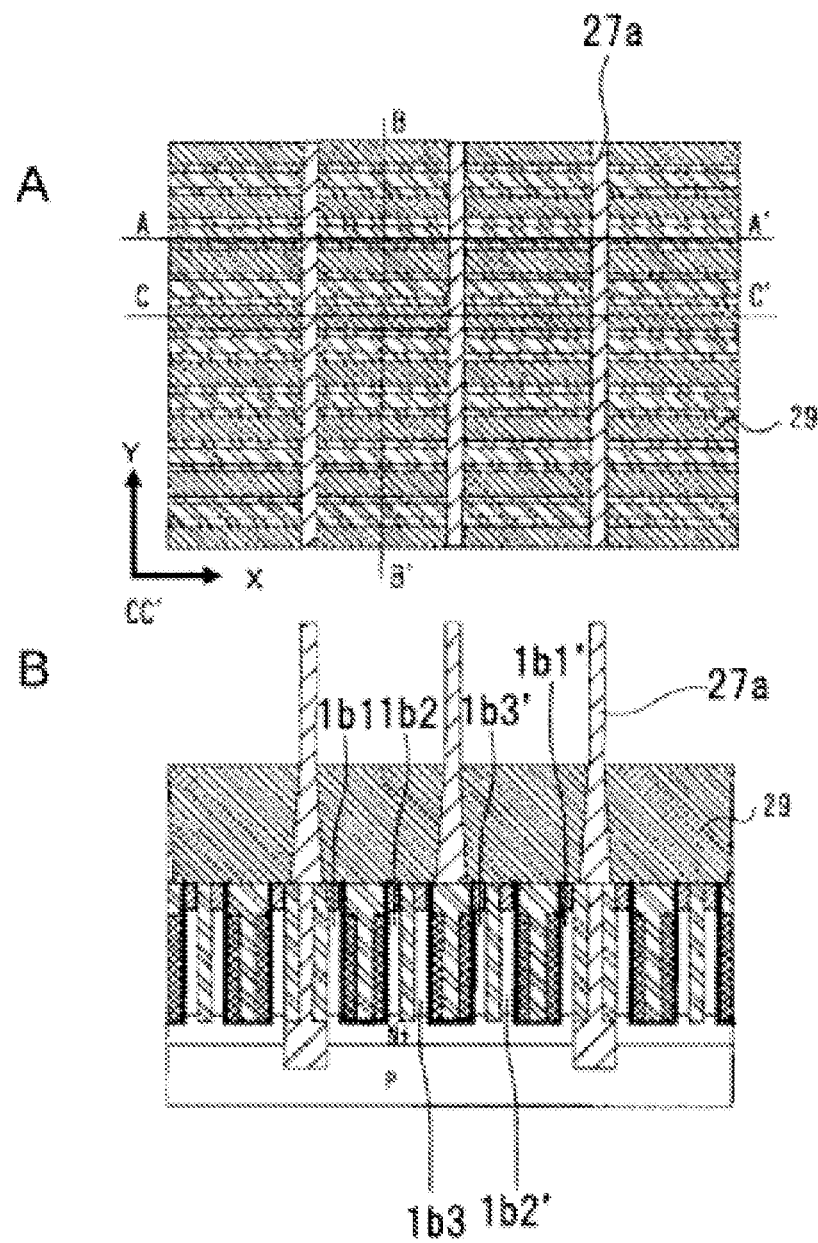
FIG. 18 is a drawing used to describe a process in the manufacture of the semiconductor device illustrated in FIG. 1.

FIG. 18A is a plan view, and FIG. 18B is a cross-sectional view along the line C-C' in FIG. 18A. Next, as illustrated in FIG. 18, a polysilicon film having a thickness of 100 nm and doped with phosphorus is deposited over the entire surface by CVD. The polysilicon film is then etched back by dry etching until the silicon nitride film 22 (which is not shown in the drawings) is exposed, thereby forming capacitive contact plugs 29. By this means, the capacitive contact plugs 29 are formed in such a way that they are isolated in the Y-direction by means of the silicon nitride film 22 and the second bit lines (which are not shown in the drawings), and are isolated in the X-direction by means of the isolation-assisting insulating films 27a. In other words, the capacitive contact plugs are capacitive contact plugs 29 which entirely fill the openings demarcated by the silicon nitride films 22 and the second bit lines, which extend in the X-direction, and the isolation-assisting insulating films 27a which extend in the Y-direction. At this stage, the sets of three semiconductor pillars 1b1, 1b2 and 1b3, and the sets of three semiconductor pillars 1b1', 1b2' and 1b3' are respectively in a state in which they are short-circuited by means of the capacitive contact plugs 29. Therefore, in order to make independent capacitive contact plugs corresponding to each semiconductor pillar 1b, the capacitive contact plugs 29 must be further separated in the X-direction.

Figure 19:
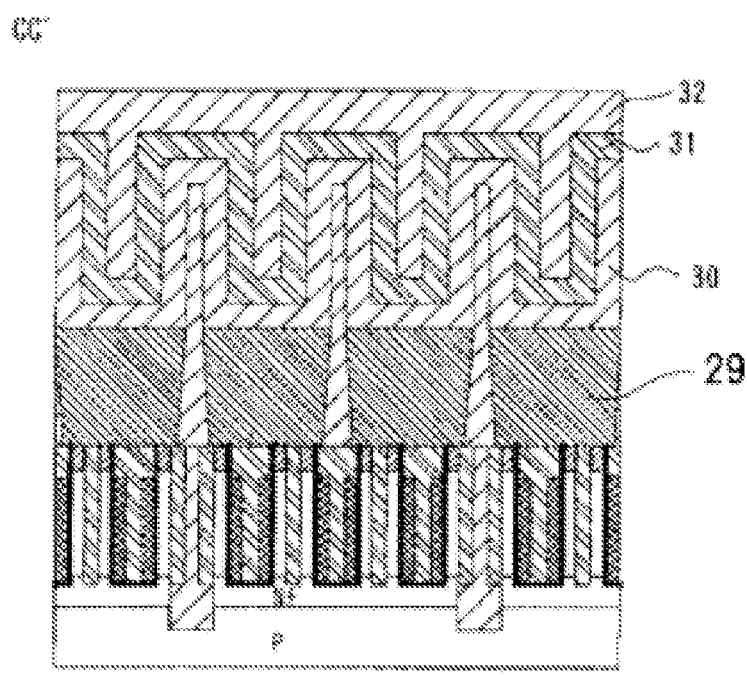
FIG. 19 is a drawing used to describe a process in the manufacture of the semiconductor device illustrated in FIG. 1.

FIG. 19 is a cross-sectional view corresponding to a cross-section along the line C-C' in FIG. 18A. Next, as illustrated in FIG. 19, a laminated insulating film is formed over the entire surface to form a mask for use in separating the capacitive contact plugs 29 in the X-direction (first direction) for each semiconductor pillar 1b. In order to form said mask using a laminated insulating film, use is made of a laminated film formed by alternately laminating two types of insulating film having different etching rates. More specifically, for example, as illustrated in FIG. 19, a three-layer laminated insulating film is formed using CVD to deposit successively a first silicon dioxide film 30 having a thickness of 30 nm as a lowermost layer, a silicon nitride film 31 having a thickness of 30 nm as an intermediate layer, and a second silicon dioxide film 32 having a thickness of 50 nm as an uppermost layer.

Figure 20:
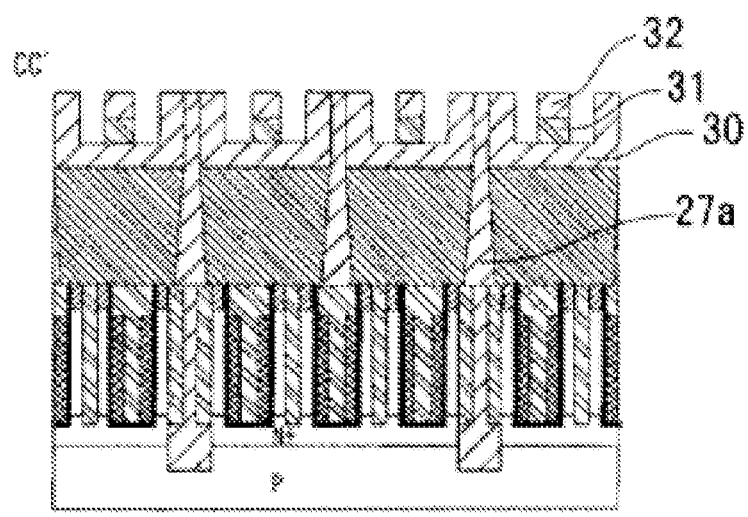
FIG. 20 is a drawing used to describe a process in the manufacture of the semiconductor device illustrated in FIG. 1.

FIG. 20 is a cross-sectional view corresponding to a cross-section along the line C-C' in FIG. 18A. As illustrated in FIG. 20, the second silicon dioxide film 32 forming the uppermost layer is etched back by dry etching to expose the silicon nitride film 31 which is the intermediate layer. The conditions used for the dry etching performed at this time are such that the etching rate of the silicon dioxide film is higher (the etching selectivity is greater) than that of the silicon nitride film. Next, the silicon nitride film 31, the upper surface of which is exposed, is etched back by dry etching. The etching conditions used for this dry etching are such that the etching rate of the silicon nitride film is higher than that of the silicon dioxide film. A mixed-gas plasma of CH2F2/Ar/O2 can be used, for example. Therefore the first and second silicon dioxide films 30 and 32 function as a mask, and the silicon nitride film 31 forming the intermediate layer remains therebelow. Next, the first and second silicon dioxide films 30 and 32, the upper surfaces of which are exposed, are etched back by dry etching. At this time, because the isolation-assisting insulating film 27a is also formed from a silicon dioxide film, a portion of the isolation-assisting insulating film 27a is also removed.

Figure 21:
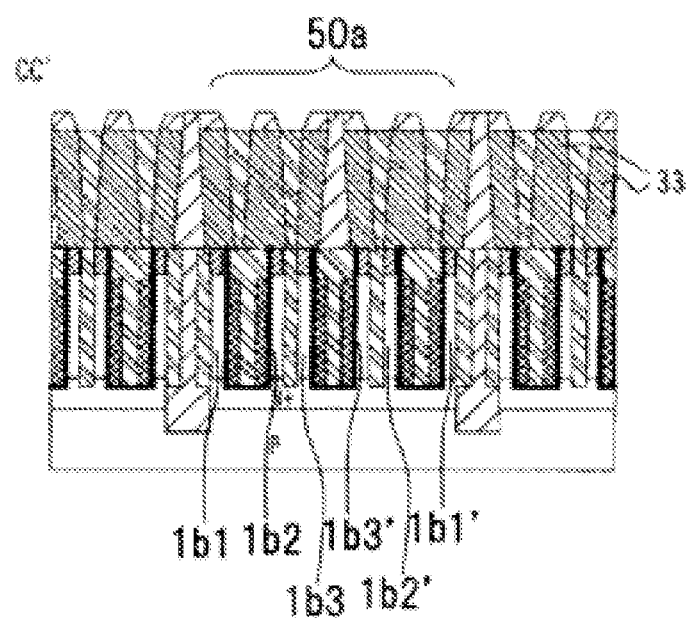
FIG. 21 is a drawing used to describe a process in the manufacture of the semiconductor device illustrated in FIG. 1.

FIG. 21 is a cross-sectional view corresponding to a cross-section along the line C-C' in FIG. 18A. As illustrated in FIG. 21, the first and second silicon dioxide films 30 and 32 are etched back by dry etching to expose the capacitive contact plugs 29. The conditions used for this dry etching are such that the etching rates of the silicon dioxide film and the silicon nitride film are the same. By this means, the intermediate layer silicon nitride films 31 used as part of the mask are also eliminated when the etching back is performed. The capacitive contact plugs 29 are dry etched, using the pattern of the remaining first and second silicon dioxide films 30 and 32 and the remaining silicon nitride films 31 as a mask. The capacitive contact plugs 29 are thus separated in the X-direction, to form one capacitive contact plug 33 on each of the semiconductor pillars, namely the first to third semiconductor pillars 1b1 to 1b3 and 1b1' to 1b3'. Further, at this time, portions of the first and second silicon dioxide films 30, 32 and the silicon nitride film 31 are removed. In this mode of embodiment, ultimately, capacitive contact plugs 33 connected respectively to the six semiconductor pillars provided on one horizontal active region 50a, namely the first to third semiconductor pillars 1b1 to 1b3 and 1b1' to 1b3', are formed.

Figure 22:
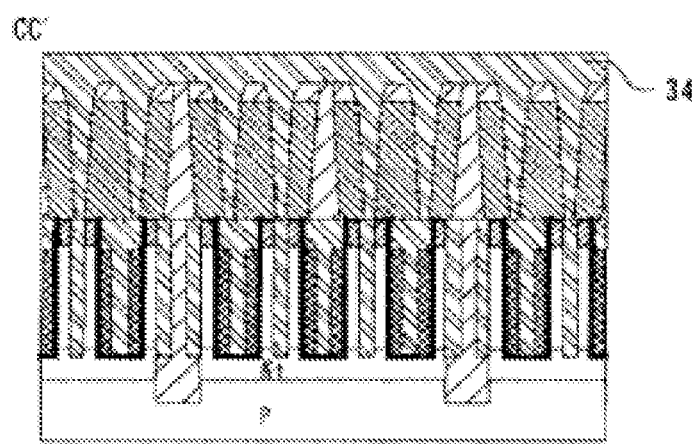
FIG. 22 is a drawing used to describe a process in the manufacture of the semiconductor device illustrated in FIG. 1.

FIG. 22 is a cross-sectional view corresponding to a cross-section along the line C-C' in FIG. 18A. As illustrated in FIG. 22, a silicon nitride film 34 having a thickness of 40 nm is formed over the entire surface by CVD.

Figure 23:
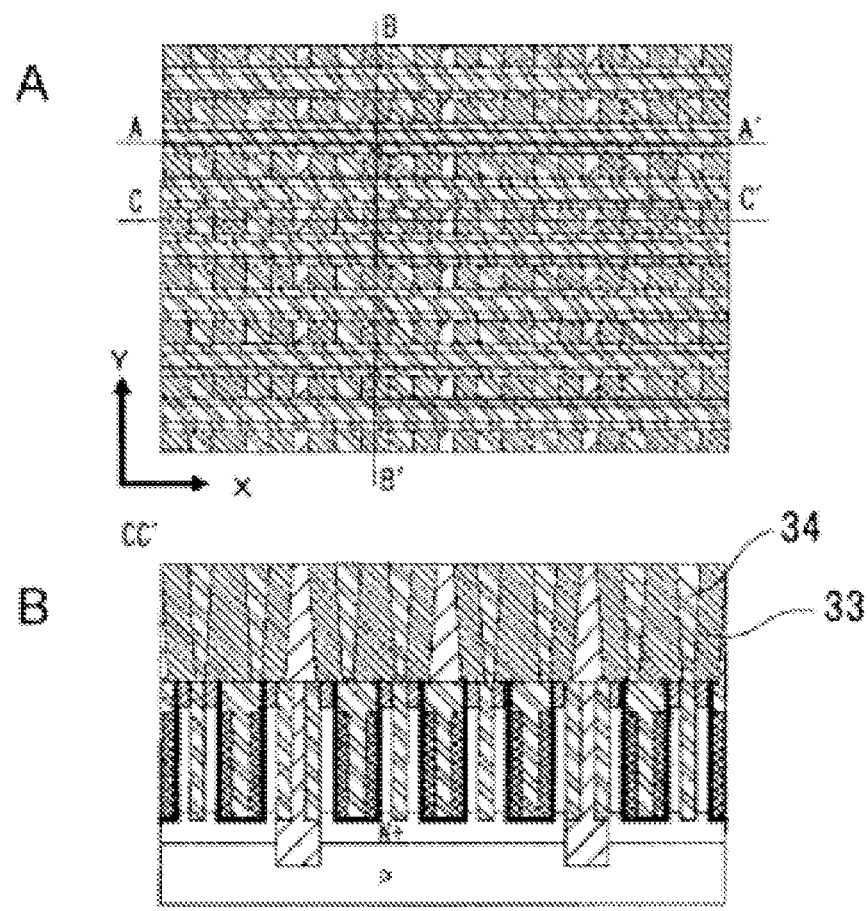
FIG. 23 is a drawing used to describe a process in the manufacture of the semiconductor device illustrated in FIG. 1.

FIG. 23A is a plan view, and FIG. 23B is a cross-sectional view along the line C-C' in FIG. 23A. Next, as illustrated in FIG. 23, the silicon nitride films 31 and 34 are subjected to dry etch-back to expose the capacitive contact plugs 33.

Figure 24:
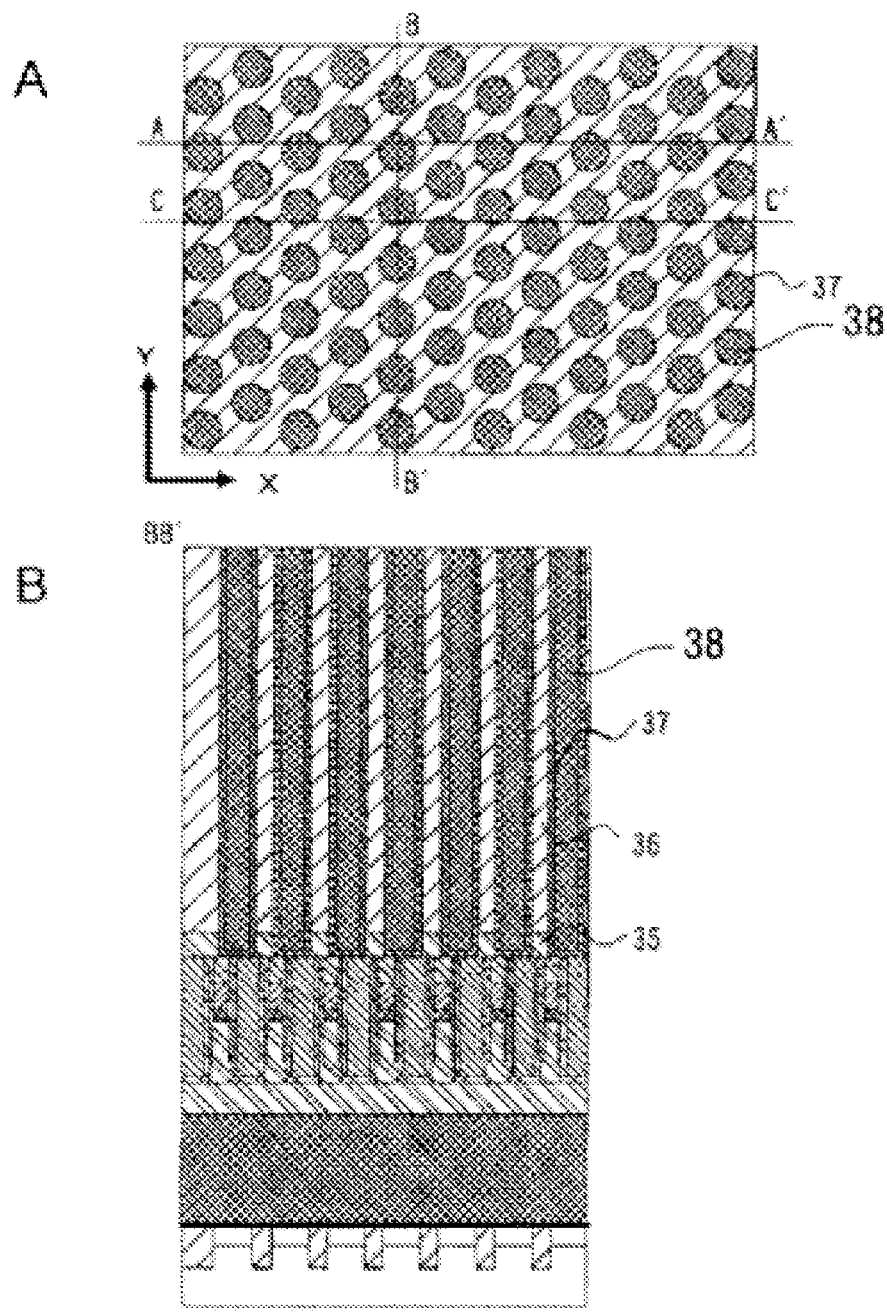
FIG. 24 is a drawing used to describe a process in the manufacture of the semiconductor device illustrated in FIG. 1.

FIG. 24A is a plan view, and FIG. 24B is a cross-sectional view along the line B-B' in FIG. 24A. Next, as illustrated in FIG. 24, a silicon nitride film 35 having a thickness of 30 nm and a silicon dioxide film 36 having a thickness of 1000 nm are formed successively over the entire surface by CVD. A photoresist film (which is not shown in the drawings) is formed on the silicon dioxide film 36, after which holes having a diameter of 30 nm are patterned in the photoresist film by lithography. The silicon nitride film 35 and the silicon dioxide film 36 are dry etched using the photoresist pattern, thereby forming contact holes in these films. Next, a titanium nitride film having a thickness of 5 nm is deposited over the entire surface by CVD, after which the titanium nitride film on the silicon dioxide film 36 is removed by dry etch-back. Lower electrodes 37 are thus formed. The semiconductor device (DRAM) according to this mode of embodiment is then completed by forming capacitive insulating films and upper electrodes (these are indicated collectively as '38' in FIG. 24) on the lower electrodes 37 in the contact holes.

Further, in the mode of embodiment described hereinabove, gate insulating films 14 and gate electrodes 15 are also formed on the side surfaces of the third semiconductor pillars 1b3 and 1b3' that are on the opposite sides to the side surfaces that oppose the second semiconductor pillars 1b2 and 1b2' in the X-direction. Further, the third semiconductor pillars 1b3 and 1b3', and the gate insulating films 14 and gate electrodes 15 on the side surfaces thereof, and the like, form vertical transistors. Thus the third semiconductor pillars 1b3 and 1b3' may form parts of vertical transistors.

It should be noted that in the descriptions of the modes of embodiment described hereinabove, as in FIGS. 1A to C, the semiconductor pillars are named the first semiconductor pillar 1b1, the second semiconductor pillar 1b2, the third semiconductor pillar 1b3, the third semiconductor pillar 1b3', the second semiconductor pillar 1b2' and the first semiconductor pillar 1b1', from the left side to the right side in the X-direction (first direction) in the horizontal active region 50a. However, this naming method is used for convenience, and the names of specific semiconductor pillars, from the first semiconductor pillar to the third semiconductor pillar, may be changed, provided that the conditions set forth in the claims of the present invention are satisfied. For example, if the third semiconductor pillars 1b3 illustrated in FIGS. 1 and 2 are referred to as 'first semiconductor pillars', and the first to third semiconductor pillars are deemed to be arranged side by side from the left side to the right side in FIGS. 1 and 2, then the first semiconductor pillars 1b1' and the second semiconductor pillars 1b2' illustrated in FIG. 1 will respectively be 'third semiconductor pillars' and 'second semiconductor pillars'. In other words, depending on which semiconductor pillar is named the 'first semiconductor pillar', the semiconductor pillars that are the 'second semiconductor pillar' and the 'third semiconductor pillar' may vary. Further, the sets comprising the first to third semiconductor pillars may also vary accordingly.

EXPLANATION OF THE REFERENCE NUMBERS

1 Semiconductor substrate
1a Semiconductor plate
1b, 1c Semiconductor pillar
2, 7, 9, 11, 13, 16, 22, 25, 26, 31, 34, 35 Silicon nitride film
3 Source region (second impurity-diffused region, first bit line)
4 Element isolation region (STI)
4a Element isolation groove
5, 10, 12, 30, 32, 36 Silicon dioxide film
6, 28 Amorphous carbon film
8 Amorphous silicon film
8a, 8b Trench
9a, 9b Straight-line pattern
9c, 9d Recessed portion
10a, 10b Straight-line pattern
14 Gate insulating film
15 Gate electrode
17, 23 Photoresist film
18 Bit contact pattern
19 Bit contact
20 Titanium nitride film
24 Tungsten film
24a Second bit line
27 SOD film
27a Isolation-assisting insulating film
29, 33 Capacitative contact plug
37 Lower electrode
38 Capacitative insulating film and upper electrode
40 First impurity-diffused region
50 Element-forming region
50a Horizontal active region
50b Oblique active region
50c Unit active region
Cap Capacitor
$L_1$, $L_2$ Gap in straight-line pattern

What is claimed is:

1. A semiconductor device comprising:
an active region extending in a first direction;
a first semiconductor pillar, a second semiconductor pillar and a third semiconductor pillar which are provided upright relative to a main surface of the active region and which are disposed side by side in succession in the first direction;
between the first semiconductor pillar and the second semiconductor pillar, a first gate insulating film which is in contact with a side surface of the first semiconductor pillar;
a first gate electrode which is in contact with the first gate insulating film;
between the first semiconductor pillar and the second semiconductor pillar, a second gate insulating film which is in contact with a side surface of the second semiconductor pillar;
a second gate electrode which is in contact with the second gate insulating film;
a first embedded insulating film located between the first gate electrode and the second gate electrode; and
between the second semiconductor pillar and the third semiconductor pillar, a second embedded insulating film which is in contact with the side surfaces of the second semiconductor pillar and the third semiconductor pillar, wherein
a bottom of the second embedded insulating film and a bottom of the first gate electrode are at a substantially same level.

2. The semiconductor device of claim 1, comprising a plurality of the active regions disposed side by side in a second direction perpendicular to the first direction, wherein:
the active regions are isolated in the second direction by means of element isolation regions which extend in the first direction;
the first to third semiconductor pillars are disposed in each active region;
the first semiconductor pillars are disposed in a linear fashion with an equal pitch spacing in the second direction, with element isolation regions interposed therebetween;
the second semiconductor pillars are disposed in a linear fashion with an equal pitch spacing in the second direction, with element isolation regions interposed therebetween;
the third semiconductor pillars are disposed in a linear fashion with an equal pitch spacing in the second direction, with element isolation regions interposed therebetween;
the first gate electrode extends continuously in the second direction in contact with the first gate insulating film on the side surface of each first semiconductor pillar; and
the second gate electrode extends continuously in the second direction in contact with the second gate insulating film on the side surface of each second semiconductor pillar.

3. The semiconductor device of claim 1, wherein a plurality of sets comprising the first to third semiconductor pillars are provided in one active region.

4. The semiconductor device of claim 1, wherein a first bit line comprising a second impurity-diffused region is provided directly below the first to third semiconductor pillars and in a state of mutual electrical connection therewith.

5. The semiconductor device of claim 4, comprising:
a second bit line located above the first to third semiconductor pillars; and a bit contact which electrically connects the first and second bit lines.

6. The semiconductor device of claim 5, wherein the second bit line comprises a metal layer.

7. The semiconductor device of claim 5, wherein the bit contact is disposed side by side with the first to third semiconductor pillars in the first direction, on the active region.

8. The semiconductor device of claim 5 comprising:
first impurity-diffused regions provided in upper portions of each of the first to third semiconductor pillars; and
capacitors which are electrically connected to each of the first impurity-diffused regions.

9. A semiconductor device comprising:
a semiconductor pillar provided in such a way that it is upright relative to a main surface of a semiconductor substrate, the semiconductor pillar having a first side surface and a second side surface opposite to the first side surface;
a first impurity-diffused region provided in an upper portion of the semiconductor pillar;
a second impurity-diffused region provided in the semiconductor substrate located directly below the semiconductor pillar;
a gate insulating film and a gate electrode provided successively on the first side surface of the semiconductor pillar; and
an embedded insulating film on the second side surface of the semiconductor pillar, wherein
a bottom of the embedded insulating film and a bottom of the gate electrode are at a substantially same level.

10. A method of manufacturing a semiconductor device, comprising:
a process of forming an active region extending in a first direction;
a process of forming a first semiconductor pillar, a second semiconductor pillar and a third semiconductor pillar which are provided upright relative to a main surface of the active region and which are disposed side by side in succession in the first direction;
a process of forming, between the first semiconductor pillar and the second semiconductor pillar, a first gate insulating film which is in contact with a side surface of the first semiconductor pillar, and a second gate insulating film which is in contact with a side surface of the second semiconductor pillar;
a process of forming a first gate electrode which is in contact with the first gate insulating film, and a second gate electrode which is in contact with the second gate insulating film;
a process of forming a second embedded insulating film which is between the second semiconductor pillar and the third semiconductor pillar and which is in contact with the side surfaces of the second semiconductor pillar and the third semiconductor pillar; and
a process of forming a first embedded insulating film between the first gate electrode and the second gate electrode, after the first and second gate insulating films and the first and second gate electrodes have been formed, wherein a bottom of the second embedded insulating film and a bottom of the first gate electrode are at a substantially same level.

11. The method of claim 10, wherein:
in the process of forming the active region, a plurality of the active regions are formed disposed side by side in a second direction perpendicular to the first direction;
in the process of forming the first to third semiconductor pillars, the first to third semiconductor pillars are formed in such a way that first to third semiconductor pillars are disposed in each active region;
the first semiconductor pillars are disposed in a linear fashion with an equal pitch spacing in the second direction;
the second semiconductor pillars are disposed in a linear fashion with an equal pitch spacing in the second direction;
the third semiconductor pillars are disposed in a linear fashion with an equal pitch spacing in the second direction; and
in the process of forming the first and second gate electrodes, the first and second gate electrodes are formed in such a way that the first gate electrode extends continuously in the second direction and is in contact with the first gate insulating film on the side surface of each first semiconductor pillar, and the second gate electrode extends continuously in the second direction and is in contact with the second gate insulating film on the side surface of each second semiconductor pillar.

12. The method of claim 10, wherein, in the process of forming the first to third semiconductor pillars, a plurality of sets comprising the first to third semiconductor pillars are provided in one active region.

13. The method of claim 10, comprising a process of forming a first bit line comprising a second impurity-diffused region, directly below the first to third semiconductor pillars and in a state of mutual electrical connection therewith.

14. The method of claim 13, comprising, after the process of forming the first bit line,
a process of forming a bit contact in such a way that it is electrically connected to the first bit line, and
a process of forming a second bit line above the first to third semiconductor pillars in such a way that it is electrically connected to the bit contact.

15. The method of claim 14, wherein the second bit line comprises a metal layer.

16. The method of claim 14, wherein, in the process of forming the bit contact, the bit contact is formed so as to be disposed side by side with the first to third semiconductor pillars in the first direction, on the active region.

17. The method of claim 14, comprising:
a process of forming first impurity-diffused regions in upper portions of each of the first to third semiconductor pillars; and
a process of forming capacitors which are electrically connected to each of the first impurity-diffused regions.

* * * * *